United States Patent
Tan

(10) Patent No.: US 7,925,959 B2
(45) Date of Patent: *Apr. 12, 2011

(54) SYSTEMS AND METHODS FOR TRI-COLUMN CODE BASED ERROR REDUCTION

(75) Inventor: Weijun Tan, Longmont, CO (US)

(73) Assignee: Agere Systems Inc., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/833,959

(22) Filed: Jul. 10, 2010

(65) Prior Publication Data

US 2010/0275099 A1 Oct. 28, 2010

Related U.S. Application Data

(62) Division of application No. 11/461,198, filed on Jul. 31, 2006, now Pat. No. 7,779,331.

(51) Int. Cl.
*G06F 3/00* (2006.01)
*G06F 3/048* (2006.01)

(52) U.S. Cl. ........................ 714/758; 714/800

(58) Field of Classification Search .......... 714/800, 714/804, 795, 724, 758; 375/262, 341, 146
See application file for complete search history.

(56) References Cited

U.S. PATENT DOCUMENTS

| | | |
|---|---|---|
| 5,278,846 A | 1/1994 | Okayama et al. |
| 5,325,402 A | 6/1994 | Ushirokawa |
| 5,392,299 A | 2/1995 | Rhines et al. |
| 5,513,192 A * | 4/1996 | Janku et al. .......... 714/804 |
| 5,612,964 A | 3/1997 | Haraszti |
| 5,701,314 A | 12/1997 | Armstrong et al. |
| 5,717,706 A | 2/1998 | Ikeda |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister et al. |
| 6,023,783 A | 2/2000 | Divsalar et al. |
| 6,029,264 A | 2/2000 | Kobayashi et al. |
| 6,041,432 A | 3/2000 | Ikeda |
| 6,097,764 A | 8/2000 | McCallister et al. |
| 6,216,251 B1 | 4/2001 | McGinn |

(Continued)

FOREIGN PATENT DOCUMENTS

| | | |
|---|---|---|
| WO | WO 2006/016751 | 2/2006 |
| WO | WO 2007/091797 | 8/2007 |

OTHER PUBLICATIONS

U.S. Appl. No. 11/461,026, filed Jul. 31, 2006, Tan, Weijun.

(Continued)

*Primary Examiner* — Phung M Chung
(74) *Attorney, Agent, or Firm* — Hamilton, DeSanctis & Cha

(57) ABSTRACT

Various systems and methods for tri-column code based error reduction are disclosed herein. For example, a digital information system is disclosed that includes channel detector. Such a channel detector receives an encoded data set and provides an output representing the encoded data set. The exemplary system further includes a decoder that receives the first output and is operable to perform three slope parity checks on the received first output. In turn, the decoder provides another output representing the encoded data set.

19 Claims, 20 Drawing Sheets

U.S. PATENT DOCUMENTS

| | | |
|---|---|---|
| 6,266,795 B1 | 7/2001 | Wei |
| 6,317,472 B1 | 11/2001 | Choi et al. |
| 6,351,832 B1 | 2/2002 | Wei |
| 6,377,610 B1 | 4/2002 | Hagenauer et al. |
| 6,438,717 B1 | 8/2002 | Butler et al. |
| 6,473,878 B1 | 10/2002 | Wei |
| 6,625,775 B1 | 9/2003 | Kim |
| 6,671,404 B1 | 12/2003 | Katawani et al. |
| 6,748,034 B2 | 6/2004 | Hattori et al. |
| 6,757,862 B1 | 6/2004 | Marianetti |
| 6,788,654 B1 | 9/2004 | Hashimoto et al. |
| 6,810,502 B2 | 10/2004 | Eidson |
| 6,986,098 B2 | 1/2006 | Poeppelman |
| 7,010,051 B2 | 3/2006 | Murayama et al. |
| 7,047,474 B2 | 5/2006 | Rhee et al. |
| 7,058,873 B2 | 6/2006 | Song et al. |
| 7,093,179 B2 | 8/2006 | Shea |
| 7,184,486 B1 | 2/2007 | Wu et al. |
| 7,191,378 B2 | 3/2007 | Eroz et al. |
| 7,203,887 B2 | 4/2007 | Eroz et al. |
| 7,257,764 B2 | 8/2007 | Suzuki et al. |
| 7,310,768 B2 | 12/2007 | Eidson et al. |
| 2004/0098659 A1 | 5/2004 | Bjerke et al. |
| 2005/0216819 A1 | 9/2005 | Chugg et al. |
| 2005/0273688 A1 | 12/2005 | Argon |
| 2006/0020872 A1 | 1/2006 | Richardson et al. |
| 2006/0031737 A1 | 2/2006 | Chugg et al. |
| 2006/0140311 A1 | 6/2006 | Ashley et al. |
| 2006/0168493 A1 | 7/2006 | Song et al. |
| 2006/0195772 A1 | 8/2006 | Graef et al. |
| 2006/0248435 A1 | 11/2006 | Haratsch |
| 2007/0011569 A1 | 1/2007 | Vila Casado et al. |
| 2007/0047635 A1 | 3/2007 | Stojanovic et al. |
| 2007/0286270 A1 | 12/2007 | Huang et al. |
| 2008/0049825 A1 | 2/2008 | Chen et al. |
| 2008/0055122 A1* | 3/2008 | Tan .................. 341/52 |
| 2008/0065970 A1* | 3/2008 | Tan .................. 714/800 |
| 2008/0168330 A1 | 7/2008 | Graef et al. |

OTHER PUBLICATIONS

U.S. Appl. No. 11/461,283, filed Jul. 31, 2006, Tan, Weijun.

Casado et al., Multiple-rate low- denstiy parity-check codes with constant blocklength, IEEE Transations on communications, Jan. 2009, vol. 57, pp. 75-83.

Collins and Hizlan, "Determinate State Convolutional Codes" IEEE Transactions on Communications, Dec. 1993.

Eleftheriou, E. et al., "Low Density Parity-Check Codes for Digital Subscriber Lines", Proc ICC 2002, pp. 1752-1757.

Han and Ryan, "Pinning Techniques for Low-Floor Detection/Decoding of LDPC-Coded Partial Response Channels", 5th International Symposium on Turbo Codes &Related Topics, 2008.

Mohsenin et al., "Split Row: A Reduced Complexity, High Throughput LDPC Decoder Architecture", pp. 1-6, printed from www.ece.ucdavis.edu on Jul. 9, 2007.

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Yeo et al., "VLSI Architecture for Iterative Decoders in Magnetic Storage Channels", Mar. 2001, pp. 748-755, IEEE trans. Magnetics, vol. 37, No. 2.

Zhong et al., "Area-Efficient Min-Sum Decoder VLSI Architecture for High-Rate QC-LDPC Codes in Magnetic Recording", pp. 1-15, Submitted 2006, not yet published.

Zhong, "Block-LDPC: A Practical LDPC Coding System Design Approach", IEEE Trans. On Circuits, Regular Papers, vol. 5, No. 4, pp. 766-775, Apr. 2005.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SRC TECHRON, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "VLSI Architecture of LDPC Based Signal Detection and Coding System for Magnetic Recording Channel", Thesis, RPI, Troy, NY, pp. 1-95, May 2006.

* cited by examiner

SYSTEMS AND METHODS FOR TRI-COLUMN CODE BASED ERROR REDUCTION

CROSS REFERENCE TO RELATED APPLICATIONS

The present application claims priority to (is a divisional of) U.S. patent application Ser. No. 11/461,198 entitled "Systems and Methods for Tri-Column Code Based Error Reduction", by Tan and filed Jul. 31, 2006, and now issued as U.S. Pat. No. 7,779,331. The entirety of the aforementioned application is incorporated herein by reference for all purposes.

The present application is also related to U.S. patent application Ser. No. 11/461,026 entitled "Systems and Methods for Code Dependency Reduction", by Tan, and now issued as U.S. Pat. No. 7,801,200; and U.S. Patent No. 7,802,163 entitled "Systems and Methods for Code Based Error Reduction", by Tan. Both of the foregoing references are assigned to an entity common hereto, filed on Jul. 31, 2006, and incorporated herein by reference in their entirety for all purposes.

BACKGROUND OF THE INVENTION

The present invention is related to systems and methods for detecting and decoding digital information. More particularly, the present invention relates to systems and methods for detecting and correcting errors associated with an information transfer.

Digital communication systems (e.g., sets of wireless communication devices) and digital storage systems (e.g., hard disk drives) provide for transfer of different types of information. For example, in the case of communication systems, digital information is transferred substantially in real time from one communication device to another. In contrast, digital information transfer involving digital storage systems typically involves non-real time transfer of digital information that was previously stored to a storage device. While there are fundamental differences between the aforementioned information transfer approaches, the general goal of both approaches is to transfer information as accurately as possible in the presence of impairments such as noise and inter-symbol interference (ISI).

The goal of increasing accuracy of information transfer has fueled development of progressively more complex information transfer approaches that include increasingly elaborate error correction schemes (ECSs). As an example, a state of the art information transfer approach may include a substantial number of parity bits built into the information being transferred. These parity bits introduce redundancy into the signal prior to transmission, and are subsequently used to decode the encoded information. FIG. 1 depicts an exemplary state of the art transfer system tailored for a digital storage system. It should be noted that a typical state of the art system tailored for a digital communication system would include the same level of complexity or possibly greater.

Turning to FIG. 1, a block diagram is provided for a known digital storage system 1 that utilizes a parity checking approach for error detection and correction. Digital storage system 1 includes an encoder 2 that encodes information by including parity bits in the information. Encoder 2 is typically a parity based block code encoder. After the original information is encoded, it is provided to recoding channel 3 that typically includes various physical and electrical components, such as a read write head, a read write head armature, a recoding media, a pre-amplifier, or other related circuitry or components.

The encoded information is passed from recording channel 3 to a soft output Viterbi algorithm (SOVA) channel detector 4. SOVA channel detector 4 processes the received encoded information using a bit detection algorithm. The output of SOVA channel detector 4 includes a combination of hard decisions and reliability estimates (i.e., respective estimates as to the reliability of the respective hard decisions). Both the soft and hard outputs of SOVA channel detector 4 are provided to a decoder 5 that is responsible for decoding the recovered information bits using the parity bits.

Operation of digital storage system 1 is exemplified where original information (e.g., uk=010110) is to be stored in recording channel 3. The original information is represented by Table 1 below.

TABLE 1

| Original Information (uk) | |
|---|---|
| 0 | 1 |
| 1 | 1 |
| 0 | 0 |

The original information (uk) is provided to encoder 2 that encodes the information. Where it is assumed that encoder 2 is a turbo product code (TPC) encoder, a parity bit is added to each row and to each column of table 1 to produce an even parity code (i.e., each column and each row contains an even number of 1's). Thus, the original information represented by a 3×2 table is formed into encoded information (ck) that is formed in a 4×3 table. The parity laden 4×3 table is represented as table 2 below.

TABLE 2

| Original Information Interleaved with Parity (ck) | | |
|---|---|---|
| 0 | 1 | 1 |
| 1 | 1 | 0 |
| 0 | 0 | 0 |
| 1 | 0 | 1 |

For simplicity, the example assumes that each column of table 2 corresponds to a single parity codeword. It may be, however, that a more complex interleaving may be utilized.

In this example the resulting codeword, ck=010111001001, is recorded by recording channel 3. When retrieved from recording channel 3, a signal (xk) provided from recording channel 3 may be corrupted by noise (nk) resulting in a corrupted signal (yk). The noise (nk) may be, for example, additive Gaussian noise. SOVA channel detector 4 receives the corrupted signal (yk) and produces hard decisions and corresponding soft reliability estimates. Decoder 5 receives the output of SOVA channel detector 4 and decodes the output to recover the original information using the interleaved parity information.

It has been recognized that various schemes such as the aforementioned scheme are often limited in their ability to detect and correct errors, or they are overly complex resulting in the wasteful use of circuitry and the corresponding waste of power. Hence, for at least the aforementioned reasons, there exists a need in the art for advanced systems and methods for error reduction.

BRIEF SUMMARY OF THE INVENTION

The present invention is related to systems and methods for detecting and decoding digital information. More particularly, the present invention relates to systems and methods for detecting and correcting errors associated with an information transfer.

Various embodiments of the present invention provide digital information systems that include a channel detector. Such a channel detector receives an encoded data set and provides an output representing the encoded data set. The systems further include a decoder that receives the first output and is operable to perform three slope parity checks on the received first output. In turn, the decoder provides another output representing the encoded data set. In some instances of the aforementioned embodiments, the encoded data set is represented as columns and rows. In such instances, the slope parity checks operate on a first group of data bits traversing the encoded data set at a first angle, a second group of data bits traversing the encoded data set at a second angle, a third group of data bits traversing the encoded data set at a third angle. In some cases the three angles are distinct from one another and can be either a zero slope, a greater than zero slope or a less than zero slope. Further, in some instances of the aforementioned embodiments, at least one of the three slopes is programmable.

In some instances of the aforementioned embodiments, each of the slope parity checks operate on diagonal data bits cutting across the columns and rows of the encoded data set and including at least one bit from each column of the encoded data set. In various cases of the aforementioned embodiments, the channel detector is a soft output Viterbi algorithm channel detector or a MAP. In one or more cases of the aforementioned embodiments, the decoder is a low-density parity check decoder.

Other embodiments of the present invention provide methods for error reduction in a digital information system. Such methods include providing an encoded data set that is represented as columns and rows. The encoded data set includes three groups of parity data arranged as three columns of the encoded data set. The methods further include providing a decoding system that includes a channel detector and a decoder. The channel detector receives the encoded data set and provides a channel detector output representative of the encoded data set. The decoder receives the channel detector output and performs a three slope parity checks. One of the slope parity checks uses one group of the parity data, another of the slope parity checks uses another group of the parity data, and yet another of the slope parity checks uses the other group of parity data. In some instances of the aforementioned embodiments, the angle of one of the slope parity checks is different from the angle of the other two slope parity checks. Further, in some cases, the angle of at least one of the slope parity checks is programmable. In particular cases, the angles of all three of the slope parity checks are programmable.

In one or more instances of the aforementioned embodiments, a simplistic parity check is implemented where each of the three slope parity checks relies on parity data from only one of the groups of parity data and does not rely on parity data from the other groups of parity data. Thus, the each of the slope parity checks is exclusive of the parity data from two of the three groups of parity data. In other instances of the aforementioned embodiments, a more complex parity check is implemented where one of the slope parity checks relies on parity data from all three groups of parity data, another of the slope parity checks relies on data from two of the three groups of parity data, and the third slope parity check relies on parity data from only one of the groups of parity data.

Yet other embodiments of the present invention provide methods for data encoding. Such methods include receiving an un-encoded data set that is represented as an array of columns and rows. Three groups of data bits traversing the un-encoded data set at respective angles are identified. Parity for one of the groups traversing at one angle is calculated and assembled into a column of parity bits. In addition, parity for another of the groups traversing at another angle is calculated and assembled into another column of parity bits, and parity for the last of the groups traversing at yet another angle is calculated and assembled into yet another column of parity bits. In some instances of the aforementioned embodiments, calculating parity for each of the groups is exclusive of parity calculated for any of the other groups. In other instances of the aforementioned embodiments, calculating parity for one or more of the groups includes using parity that was previously calculated for one of the other groups.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for detecting and decoding digital information. More particularly, the present invention relates to systems and methods for detecting and correcting errors associated with an information transfer.

Various embodiments of the present invention provide digital information systems that include a channel detector. Such a channel detector receives an encoded data set and provides an output representing the encoded data set. As used herein, the phrase "encoded data set" is used in its broadest sense to mean any set of data which includes some level of encoding. Thus, for example, an encoded data set may include, but is not limited to a set of data that is augmented to include one or more parity bits. The systems further include a decoder that receives the first output and is operable to perform three slope parity checks on the received first output. In turn, the decoder provides another output representing the encoded data set. As used herein, the phrase "slope parity check" is used in its broadest sense to mean a check of parity based on a group of data bits represented as a straight line across an array of data bits whether the line is horizontal or diagonal.

In some instances of the aforementioned embodiments, the encoded data set is represented as columns and rows. In such instances, the slope parity checks operate on a first group of data bits traversing the encoded data set at a first angle, a second group of data bits traversing the encoded data set at a second angle, a third group of data bits traversing the encoded data set at a third angle. In some cases the three angles are distinct from one another and can be either a zero slope, a greater than zero slope or a less than zero slope. Further, in some instances of the aforementioned embodiments, at least one of the three slopes is programmable. It should be noted that the terms "columns" and "rows" are used in their broadest sense to mean straight lines of data intersecting at ninety degree angles. Thus, for example, an encoded data set may be represented to include horizontal columns and vertical rows, or horizontal rows and vertical columns.

Figure 1:
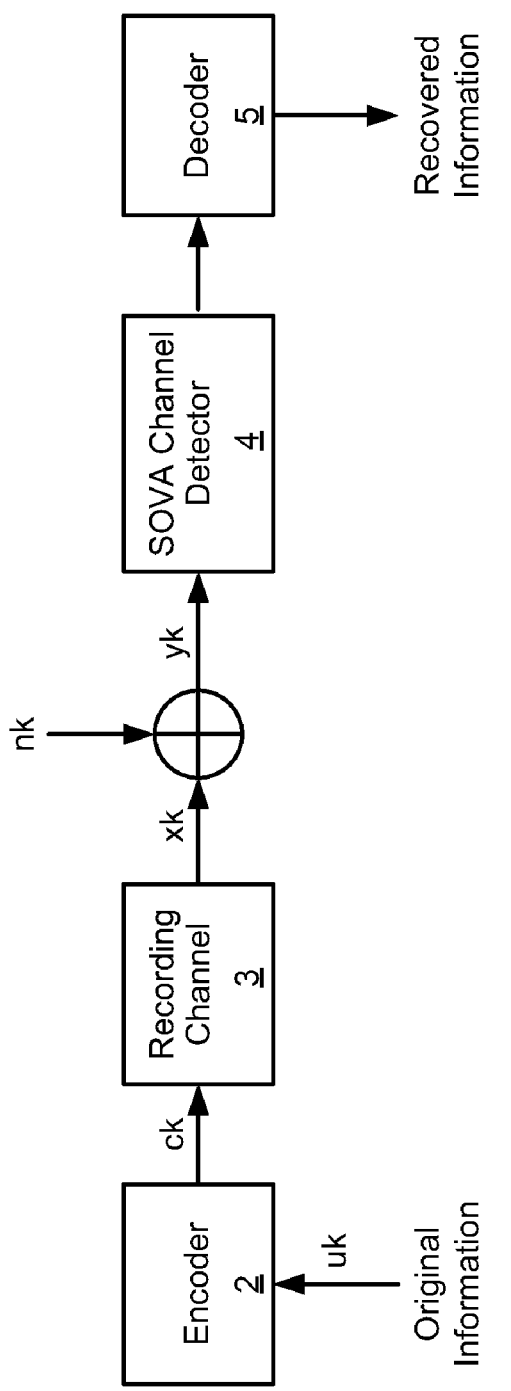
FIG. 1 is a block diagram of a known digital recording system including a SOVA channel detector and a decoder implementing an error correcting scheme.
Figure 2A:
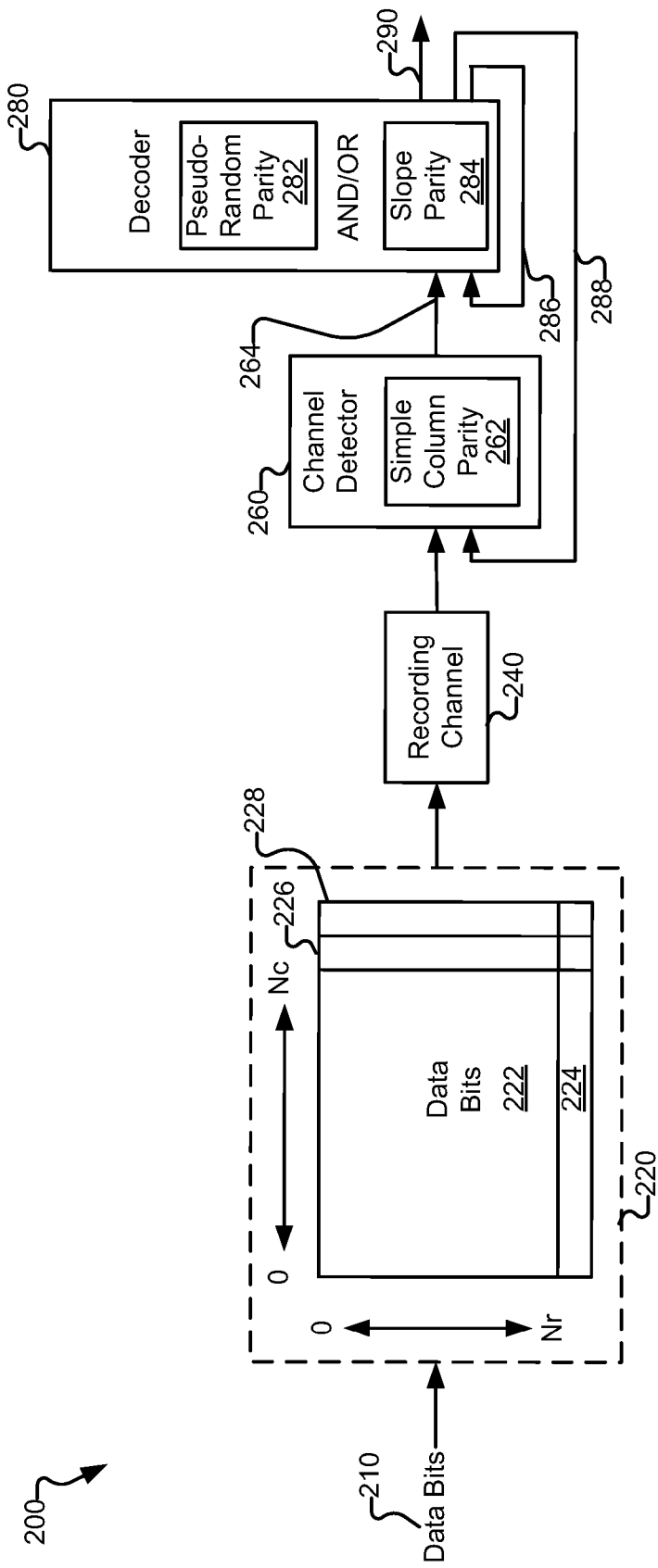
FIGS. 2a-2e depict digital recording systems in accordance with one or more embodiments of the present invention.

Turning to FIG. 2a, a digital recording system 200 in accordance with one or more embodiments of the present invention is depicted. Digital recording system 200 includes an encoder 220 capable of receiving an original data set 210 and encoding original data set 210 as a two dimensional data set 222 arranged in a number of columns (Nc) and a number of rows (Nr). It should be noted that two dimensional data set 222 may be rotated ninety degrees such that the rows become vertical and the columns become horizontal. Encoder 220 performs a low density parity check encoding using a three-dimensional single parity encoding algorithm. The first dimension includes a group of parity data arranged as a row 224 of encoded data set 222. In one embodiment of the present invention, row 224 is formed by adding one even parity bit for each column of encoded data set 222. Thus, as an example, where the first column of encoded data set includes an odd number of '1s', the first bit of row 224 will be a '1'. Alternatively, where the first column of encoded data set 222 includes an even number of '1s', the first bit of row 224 will be a '0'. Based on the disclosure provided herein, one of ordinary skill in the art will recognize a variety of other encoding approaches that may be implemented via row 224. For example, row 224 may be utilized to implement odd parity.

The second dimension includes a group of parity data arranged as a column 226 of encoded data 222, and the third dimension includes a group of parity data arranged as a column 228 of encoded data 222. In one embodiment of the present invention, column 226 and column 228 are formed by adding one even parity bit at each bit location of the respective column with the even parity bit being associated with either a pseudo-random assortment of data bits from encoded data set 222, or a sloping assortment of data bits from encoded data set 222. In one particular case, each even parity bit of column 226 and/or column 228 is associated with a group of data bits formed by applying a pseudo-random selection algorithm that selects one bit from each column of encoded data set 222. Thus, for example, where there are ten columns included in encoded data set 222, one bit from each column or ten bits are first pseudo-randomly selected. Then, where the ten bits includes an even number of '1s', a '0' is written to the associated bit location of column 226 or column 228. Alternatively, where the ten bits includes an odd number of '1s', a '1' is written to the associated bit location of column 226 or column 228.

In another particular case, each even parity bit of column 226 and/or column 228 is associated with a diagonal group of data bits from encoded data set 222. The diagonal proceeds at a given slope through encoded data set 222. For example, where the slope is zero, the diagonal group of data bits comprises a single row of data bits concluding with an associated parity bit in column 228 that corresponds to the row. As another example, where the slope is greater than zero, the diagonal group of data bits comprises bits from different rows moving in a generally straight line across encoded data set 222 and concluding with an associated parity bit in column 228 that corresponds to the slope of the diagonal. Where the bits in the diagonal include an even number of '1s', a '0' is added at the prescribed location of column 228. Alternatively, where the bits in the diagonal include an odd number of '1s', a '1' is added at the prescribed location of column 228. Based on the disclosure provided herein, one of ordinary skill in the art will recognize a variety of other encoding approaches that may be implemented via column 226 and column 228. For example, column 226 and column 228 may be utilized to implement odd parity.

It should be noted that in some embodiments of the present invention, the second and third dimensions are encoded and decoded using interleavers, and the first dimension is encoded and decoded without the use of interleavers. More particularly, in such cases, the parity bits included in column 226 and column 228 are not parities for a single row of data bits (except in the condition where the slope is equal to zero in which case the third dimension includes parities for a particular row). In some embodiments of the present invention, regardless of the single parity code of the first dimension, the single parity codes for the second and third dimensions compose a mostly regular low-density parity check code of column weight two (i.e., j=2), except for the particular cases where the parity bits exhibit a column weight of one (i.e., j=1). For this reason, such codes are generally referred to herein as a low-density single parity check code. It should be noted that the encoding of the second and third dimensions of the low-density parity check code may be extended to any regular or irregular low-density parity check codes of column weight two.

Once the encoding process is complete, encoded data set 222 of size (Nr+1) rows and (Nc+2) columns are written to a disk by recording channel 240 on a column by column basis. At this juncture it should be noted that one of ordinary skill in the art upon reading this disclosure will recognize that writing the data to disk may be done on another basis such as, for example, a row by row basis if such was desired and the appropriate accommodations were made. Further, based on reading this disclosure, one of ordinary skill in the art will recognize that the process of writing to disk may be replaced by another transmission activity depending upon the system in which the embodiments of the present invention are being deployed. Thus, for example, where the particular embodiment of the present invention is being deployed in a wireless communication system, recording channel 240 may be replaced by a transmitter and a receiver. In such cases, rather than the action of writing to disk, the action may include transmitting encoded data set 222. The encoded data set would then be received by a receiver, rather than accessed from a disk. Again, based on the disclosure provided herein, one of ordinary skill in the art will recognize a variety of other applications in which embodiments of the present invention may be deployed, and actions applied to encoded data set 222 based on the particular application.

At some point the written encoded data 222 is accessed from the disk by recording channel 240 and provided to a channel detector 260. Channel detector 260 includes a simple column parity calculator 262. Simple column parity checker 262 operates on the parity information contained in row 224 to perform an error detection/error correction function. As the parity for row 224 is calculated on a column by column basis, no interleaver is necessary to perform the error detection/error correction function. Channel detector 260 provides an output 264 incorporating the results of simple column parity 262 to a decoder 280. In some embodiments of the present invention, output 264 includes a soft output (i.e., reliability information). In some cases, where the soft output has not exceeded a predetermined reliability threshold, it is fed back to channel detector 260 as an output 288 from decoder 280. In particular cases, the soft output is increased by application of error detection/error correction implemented by decoder 280 as discussed below. In other cases, the soft output is simply fed back to channel detector 260 without modification where it is used as a priori information for further refinement in determining an increased reliability factor. It should be noted that such feedback is optional and in some cases may be replaced by a series of decoding stages as more fully discussed below in relation to FIG. 6.

Decoder 280 includes a pseudo-random parity check 282 and/or a slope parity check 284. In one particular case, pseudo-random parity check 282 operates on the parity information contained in column 226, and slope parity check 284 operates on the parity information contained in column 228. In another particular embodiment of the present invention, pseudo-random parity check 282 operates on the parity information contained in both column 226 and column 228. In yet another particular embodiment of the present invention, slope parity check 226 operates on the parity information contained in both column 226 and column 228. As pseudo-random parity check 282 and slope parity check 284 do not operate on columns, de-interleavers are included in decoder 280 to assemble the proper bits associated with each respective parity bit in column 226 and column 228. In particular, each of pseudo-random parity check 282 and slope parity check 284 individually performs a single parity error detection/error correction algorithm and the output of each of the aforementioned parity checks is summed or otherwise combined to provide a decoder output 290. In some cases, decoder output 290 includes a soft output (i.e., reliability information). In some cases, where the soft output has not exceeded a predetermined reliability threshold, it is fed back to decoder 280 as an output 286 from decoder 280. Thus, the reliability information may be iteratively used to detect and/or correct any errors in encoded data set 222. Again, it should be noted that such feedback is optional and in some cases may be replaced by a series of decoding stages as more fully discussed below in relation to FIG. 6. As one of various advantages, digital recording system 200 provides a significant gain in signal to noise ratio when compared with other encoding/decoding architectures, yet requires only a moderate increase in design complexity when compared with the same architectures.

Figure 2B:
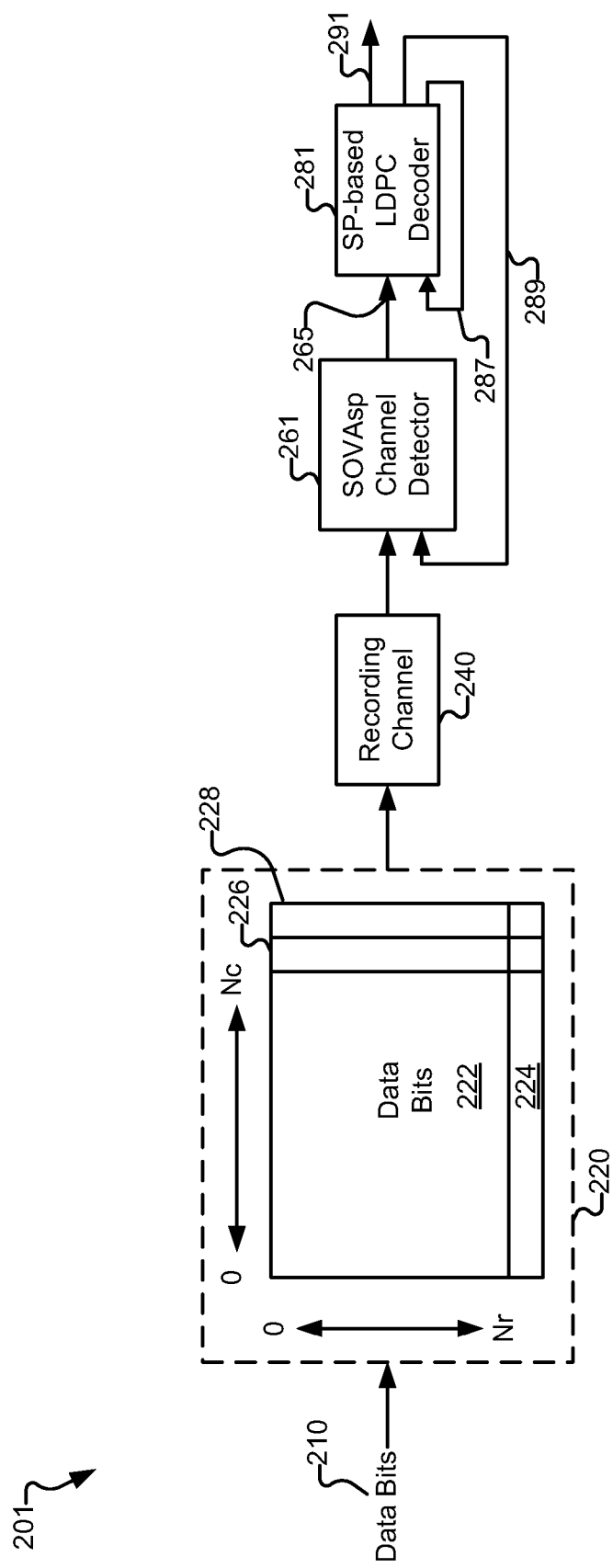

Turning to FIG. 2b, a digital recording system 201 in accordance with other embodiments of the present invention is depicted. Digital recording system 201 includes encoder 220, encoded data set 222 and recording channel 240 as described in relation to digital recording system 200 above. In digital recording system 201, column parity is implement in relation to a soft output Viterbi algorithm (SOVA) channel detector 261. As only a single bit parity scheme is implemented, channel detector 261 is referred to as a SOVAsp channel detector. The pseudo-random parity and/or slope parity checks are implemented as part of a low-density parity check (LDPC) decoder 281. As both pseudo-random parity check and slope parity check are each single bit parity schemes, decoder 281 is referred to as an SP-based, LDPC decoder.

In operation, SOVAsp channel detector 261 performs a column parity check using parity data from row 224. Based on this column parity check, an output 265 is provided to SP-based, LDPC decoder 281. Output 265 includes reliability information regarding bits decoded from encoded data set 222. In some cases, where the reliability information has not exceeded a predetermined reliability threshold, it is fed back to channel detector 261 as an output 289 from SP-based, LDPC decoder 281. In particular cases, the reliability information is increased by application of error detection/error correction implemented by SP-based, LDPC decoder 281 as discussed below. In other cases, the reliability information is simply fed back to SOVAsp channel detector 261 without modification where it is used as a priori information for further refinement in determining an increased reliability factor. As before, it should be noted that such feedback is optional and in some cases may be replaced by a series of decoding stages as more fully discussed below in relation to FIG. 6.

SP-based, LDPC decoder 281 performs a pseudo-random parity check and/or a slope parity check. The pseudo-random parity check may operate on the parity information contained in one or more of column 226 and column 228, and the slope parity check may operate on the parity information contained in one or more of column 226 and column 228. Again, as the pseudo-random parity check and the slope parity check do not operate on columns, de-interleavers are included in SP-based, LDPC decoder 281 to assemble the proper bits associated with each respective parity bit in column 226 and column 228. In particular, each of the pseudo-random parity check and the slope parity check individually performs a single parity error detection/error correction algorithm and the output of each of the aforementioned parity checks is summed or otherwise combined to provide a decoder output 291. In some cases, decoder output 291 includes reliability information. In some cases, where the reliability information has not exceeded a predetermined reliability threshold, it is fed back to SP-based LDPC decoder 281 as an output 287 from SP-based, LDPC decoder 281. Thus, the reliability information may be iteratively used to detect and/or correct any errors in encoded data set 222. Again, it should be noted that such feedback is optional and in some cases may be replaced by a series of decoding stages as more fully discussed below in relation to FIG. 6. As one of various advantages of the embodiments of the present invention, digital recording system 200 provides a significant gain in signal to noise ratio when compared with other encoding/decoding architectures, yet requires only a moderate increase in design complexity when compared with the same architectures.

Figure 2C:
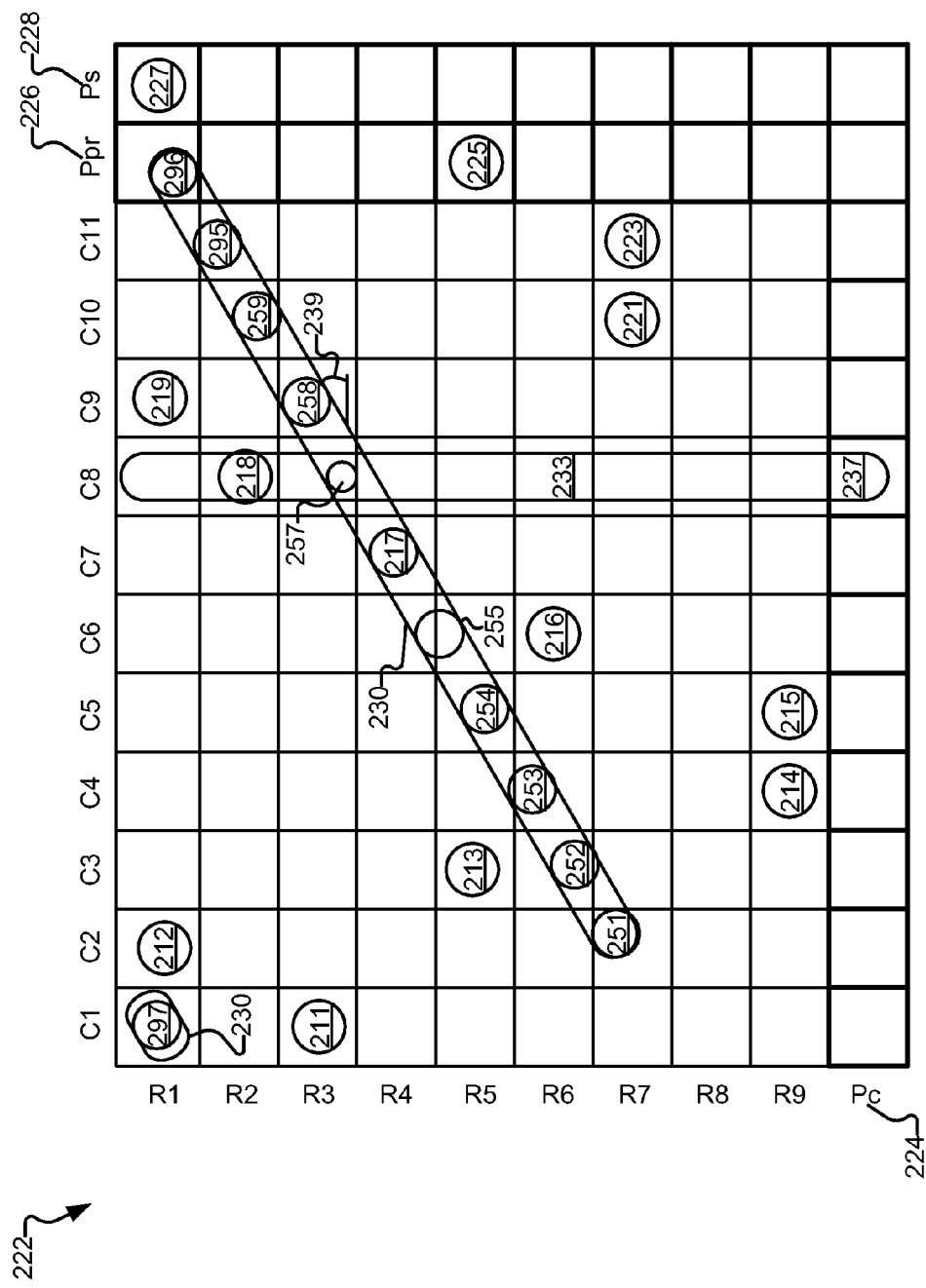

Turning to FIG. 2c, an exemplary encoded data set 222 including eleven columns (C1-C11) and nine rows (R1-R9) of encoded data is depicted. In addition, row 224 of thirteen column parity bits, column 226 of ten pseudo-random parity bits, and column 228 of ten slope parity bits are included. As previously discussed, row 224 includes individual parity bits associated with respective columns of encoded data set 222. For example, row 224 includes a parity bit 237 used to provide a predetermined parity to a column 233.

Column 226 includes individual parity bits associated with groups of pseudo-randomly selected data bits from encoded data 222. In some cases, this includes one bit from each column of encoded data 222. As just one example, a parity bit 225 in column 226 is associated with a group of data bits including a data bit 211 from column C1, a data bit 212 from column C2, a data bit 213 from column C3, a data bit 214 from column C4, a data bit 215 from column C5, a data bit 216 from column C6, a data bit 217 from column C7, a data bit 218 from column C8, a data bit 219 from column C9, and a data bit 221 from column C10, and a data bit 223 from column C11.

Column 228 includes individual parity bits associated with a groups of data bits traversing encoded data 222 at a given angle 239. In some cases, this includes one bit from each column of encoded data 222. As just one example, a parity bit 227 in column 228 is associated with a group of data bits including a data bit 297 from column C1, a data bit 251 from column C2, a data bit 252 from column C3, a data bit 253 from column C4, a data bit 254 from column C5, a data bit 255 from column C6, a data bit 217 from column C7, a data bit 257 from column C8, a data bit 258 from column C9, and a data bit 259 from column C10, a data bit 295 from column C11, and a data bit 296 from pseudo-random parity column 226. Other parity bits within column 228 are associated with similar diagonal groups of parity bits traversing encoded data set 222 at the same angle 239 such that all bits in encoded data set 222 are used in the parity checking scheme. As a simple example, where angle 239 is zero, each row (R1-R9 row 224) are associated with a respective parity bits in column 228. In one particular embodiment of the present invention, angle 239 is programmable such that different groupings of data associated with a given parity bit can be achieved. It should be noted that diagonal, horizontal, and anti-diagonal slopes may be defined in any given data set. Further, in some cases, the parity bits included within the diagonal are not included in any slope parity check. Thus, using the example of FIG. 2c, parity bit 296 may not be associated with diagonal parity data 230 and parity bit 227. In some cases, to make the code associated with column 228 more random, the diagonals are first formed, and subsequently a column random interleaver may be applied to increase the randomness of the codes.

It should be noted that the number of columns and rows depicted in FIG. 2c is merely exemplary. Based on the disclosure provided herein, one of ordinary skill in the art will appreciate a variety of other column and row dimensions that may be used to achieve desired design constraints. For example, the data may be arranged in a 4×4 array plus two added parity columns and an added parity row. In some embodiments of the present invention, the parity check matrix is not maintained in hardware, but rather can be calculated from the included interleavers. Further, the code length, rate, column weight of the parity check matrix, and/or the slope can be programmable. Such embodiments provide a great deal of programmability that can be tailored to meet a particular circumstance.

Figure 2D:
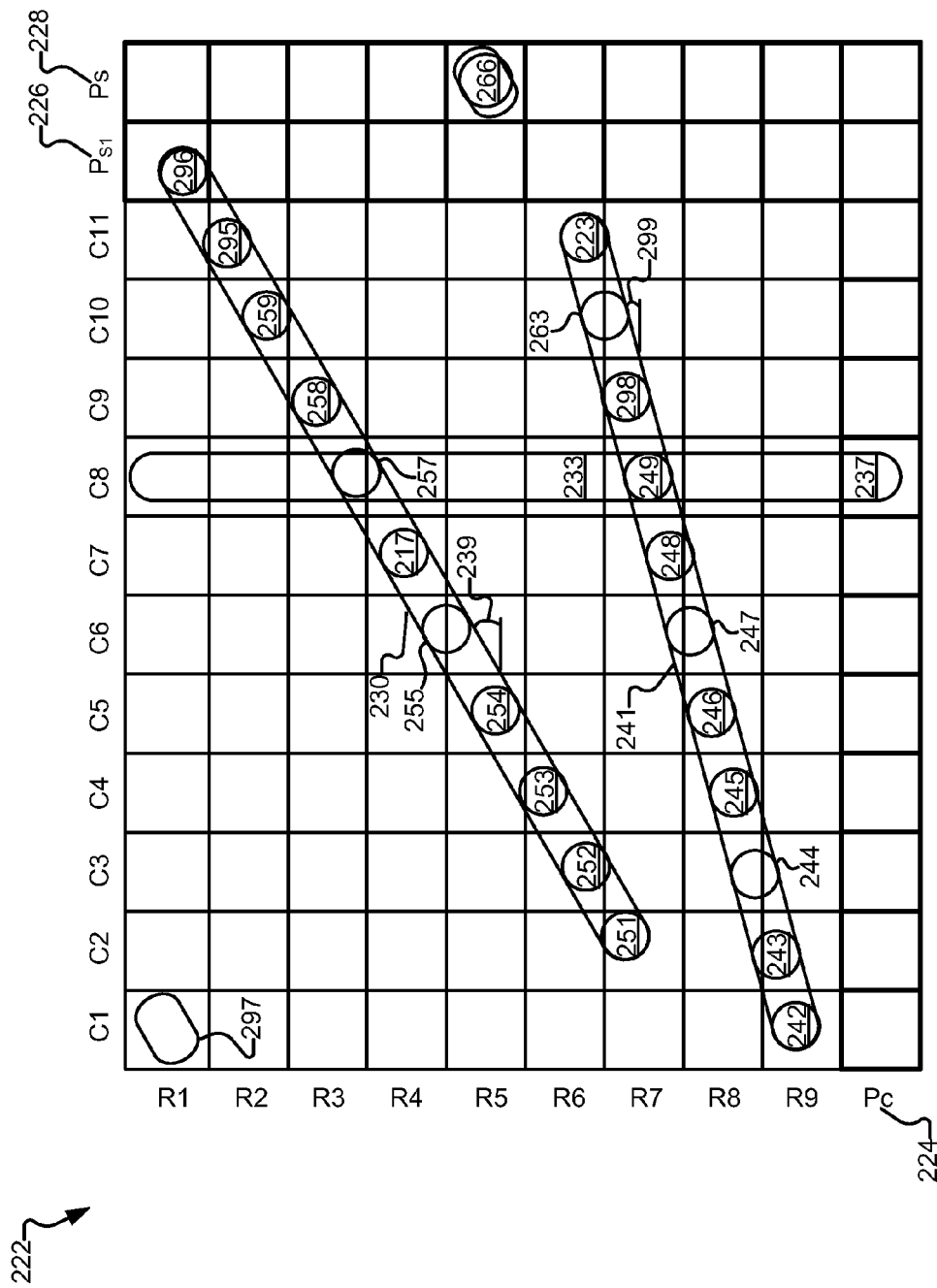

Turning to FIG. 2d, exemplary encoded data set 222 including eleven columns (C1-C11) and nine rows (R1-R9) of encoded data is again depicted. In addition, row 224 of thirteen column parity bits, column 226 of ten slope parity bits, and column 228 of ten slope parity bits are included. As previously discussed, row 224 includes individual parity bits associated with respective columns of encoded data set 222. For example, row 224 includes a parity bit 237 used to provide a predetermined parity to a column 233.

Column 226 includes individual parity bits associated with group 230 of data bits traversing encoded data 222 at angle 239. Other parity bits within column 226 are associated with similar diagonal groups of parity bits traversing encoded data set 222 at the same angle 239 such that all bits in encoded data set 222 are used in the parity checking scheme. Column 228 includes individual parity bits associated with group 241 of data bits traversing encoded data 222 at an angle 299. As just one example, a parity bit 266 in column 228 is associated with a group of data bits including a data bit 242 from column C1, a data bit 243 from column C2, a data bit 244 from column C3, a data bit 245 from column C4, a data bit 246 from column C5, a data bit 247 from column C6, a data bit 248 from column C7, a data bit 249 from column C8, a data bit 298 from column C9, and a data bit 263 from column C10, and a data bit 223 from column C11. Other parity bits within column 228 are associated with similar diagonal groups of parity bits traversing encoded data set 222 at the same angle 299 such that all bits in encoded data set 222 are used in the parity checking scheme.

Again, it should be noted that the number of columns and rows depicted in FIG. 2d is merely exemplary. Based on the disclosure provided herein, one of ordinary skill in the art will appreciate a variety of other column and row dimensions that may be used to achieve desired design constraints. For example, the data may be arranged in a 4×4 array plus two added parity columns and an added parity row. In some embodiments of the parity check matrix is not maintained in hardware, but rather can be calculated from the included interleavers. Further, the code length, rate, column weight of the parity check matrix, and/or the slope can be programmable. Such embodiments provide a great deal of programmability that can be tailored to meet a particular circumstance.

Figure 2E:
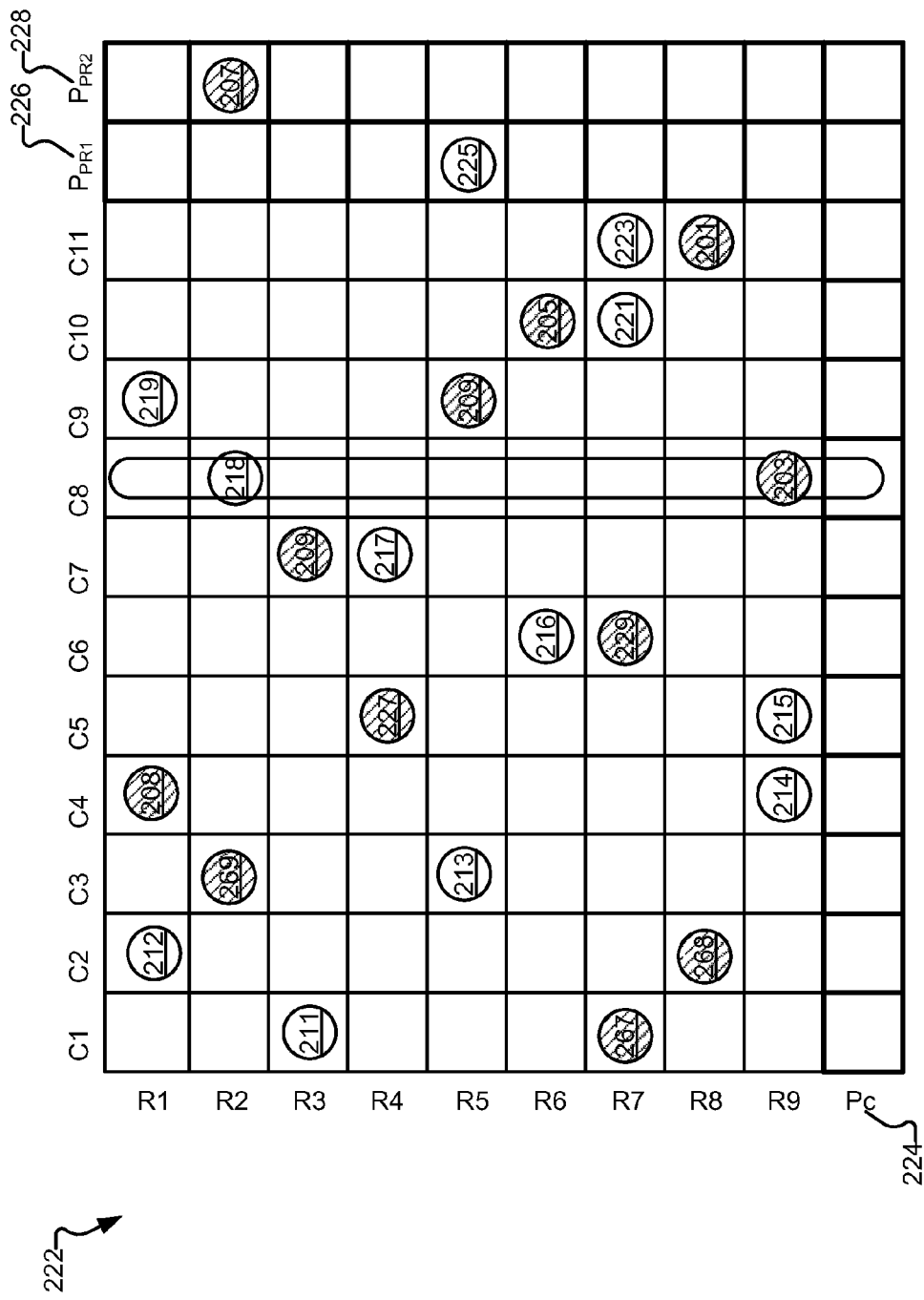

Turning to FIG. 2e, exemplary encoded data set 222 including eleven columns (C1-C11) and nine rows (R1-R9) of encoded data is again depicted. In addition, row 224 of thirteen column parity bits, column 226 of ten slope parity bits, and column 228 of ten slope parity bits are included. As previously discussed, row 224 includes individual parity bits associated with respective columns of encoded data set 222. For example, row 224 includes a parity bit 237 used to provide a predetermined parity to a column 233.

Column 226 includes individual parity bits associated with groups of pseudo-randomly selected data bits from encoded data 222. As just one example, parity bit 225 in column 226 is associated with a group of data bits including data bit 211 from column C1, data bit 212 from column C2, data bit 213 from column C3, data bit 214 from column C4, data bit 215 from column C5, data bit 216 from column C6, data bit 217 from column C7, data bit 218 from column C8, data bit 219 from column C9, and data bit 221 from column C10, and data bit 223 from column C11. Column 228 also includes individual parity bits associated with groups of pseudo-randomly selected data bits from encoded data 222. As just one example, parity bit 207 in column 228 is associated with a group of data bits including a data bit 267 from column C1, data bit 268 from column C2, data bit 269 from column C3, data bit 208 from column C4, data bit 227 from column C5, data bit 229 from column C6, data bit 209 from column C7, data bit 203 from column C8, data bit 204 from column C9, and data bit 205 from column C10, and data bit 206 from column C11.

Again, it should be noted that the number of columns and rows depicted in FIG. 2d is merely exemplary. Based on the disclosure provided herein, one of ordinary skill in the art will appreciate a variety of other column and row dimensions that may be used to achieve desired design constraints. For example, the data may be arranged in a 4×4 array plus two added parity columns and an added parity row. In some embodiments of the parity check matrix is not maintained in hardware, but rather can be calculated from the included interleavers. Further, the code length, rate, column weight of the parity check matrix, and/or the slope can be programmable. Such embodiments provide a great deal of programmability that can be tailored to meet a particular circumstance.

Figure 3A:
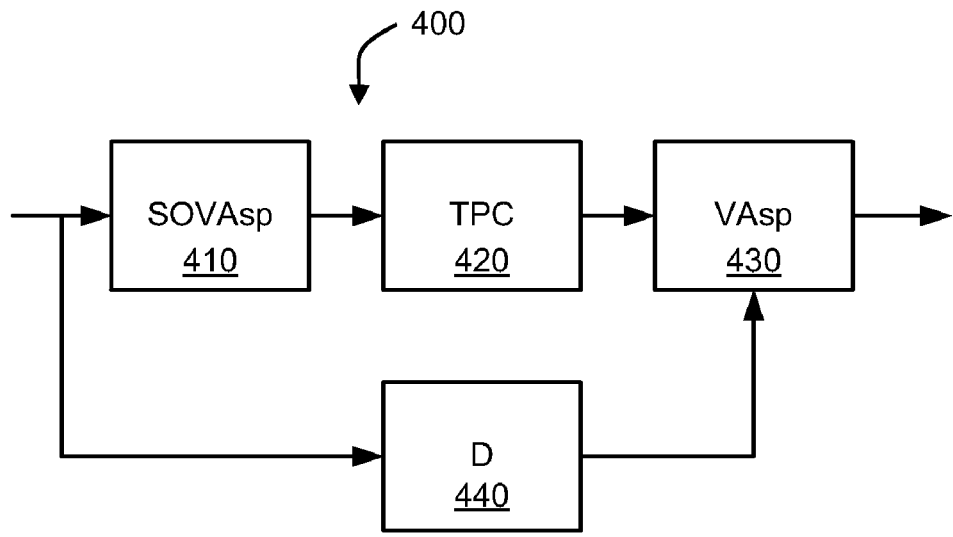
FIGS. 3a-3b depict two exemplary two stage systems in accordance with one or more embodiments of the present invention are shown.
Figure 3B:
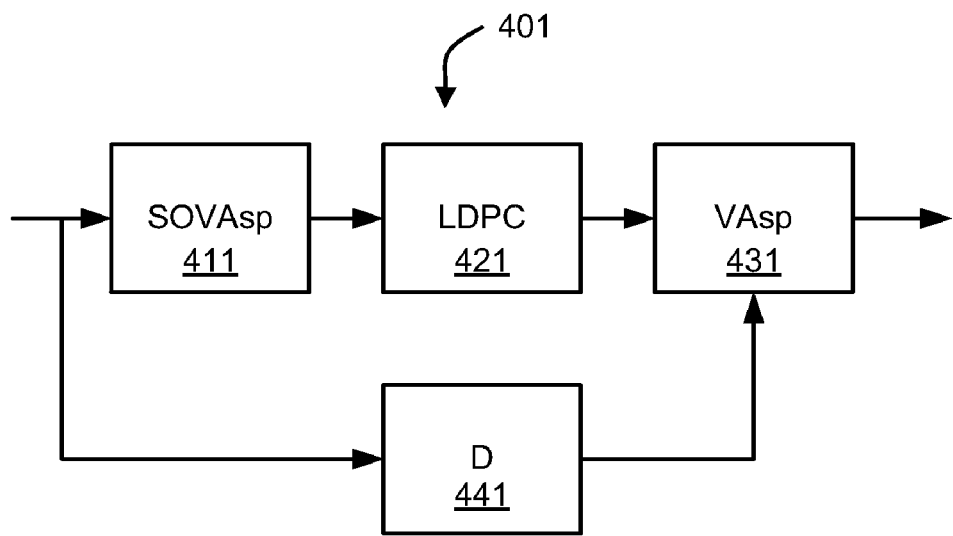

In some embodiments of the present invention, the iterative parity checking is replaced or augmented by forming a series of channel detectors and decoders. As one particular example, decoder output 290 may be provided to another channel detector that in turn feeds another decoder. This can be repeated for as many serial stages as desired. Turning to FIG. 3, two exemplary two stage systems 400, 401 are depicted. In system 400, a SOVAsp 410 and a delay element 440 receives an encoded data set. SOVAsp performs a column parity check and provides an output to, for example, a TPC decoder 420 that performs both the various TPC parity checks including re-decoding of the column parity bits decoded by SOVAsp 410. TPC decoder 420 then provides the refined error calculation to a hard output Viterbi channel detector 430 which receives the delayed original encoded data and again performs a refined column parity check. Based on the disclosure provided herein, one of ordinary skill in the art will recognize a myriad of stages including additional SOVA channel detectors, decoders and hard output channel detectors that may be employed in accordance with one or more embodiments of the present invention. Turning to FIG. 3b, system 401 includes an LDPC decoder 421 in place of the TPC decoder of system 400 to perform substantially the same function.

Figure 4:
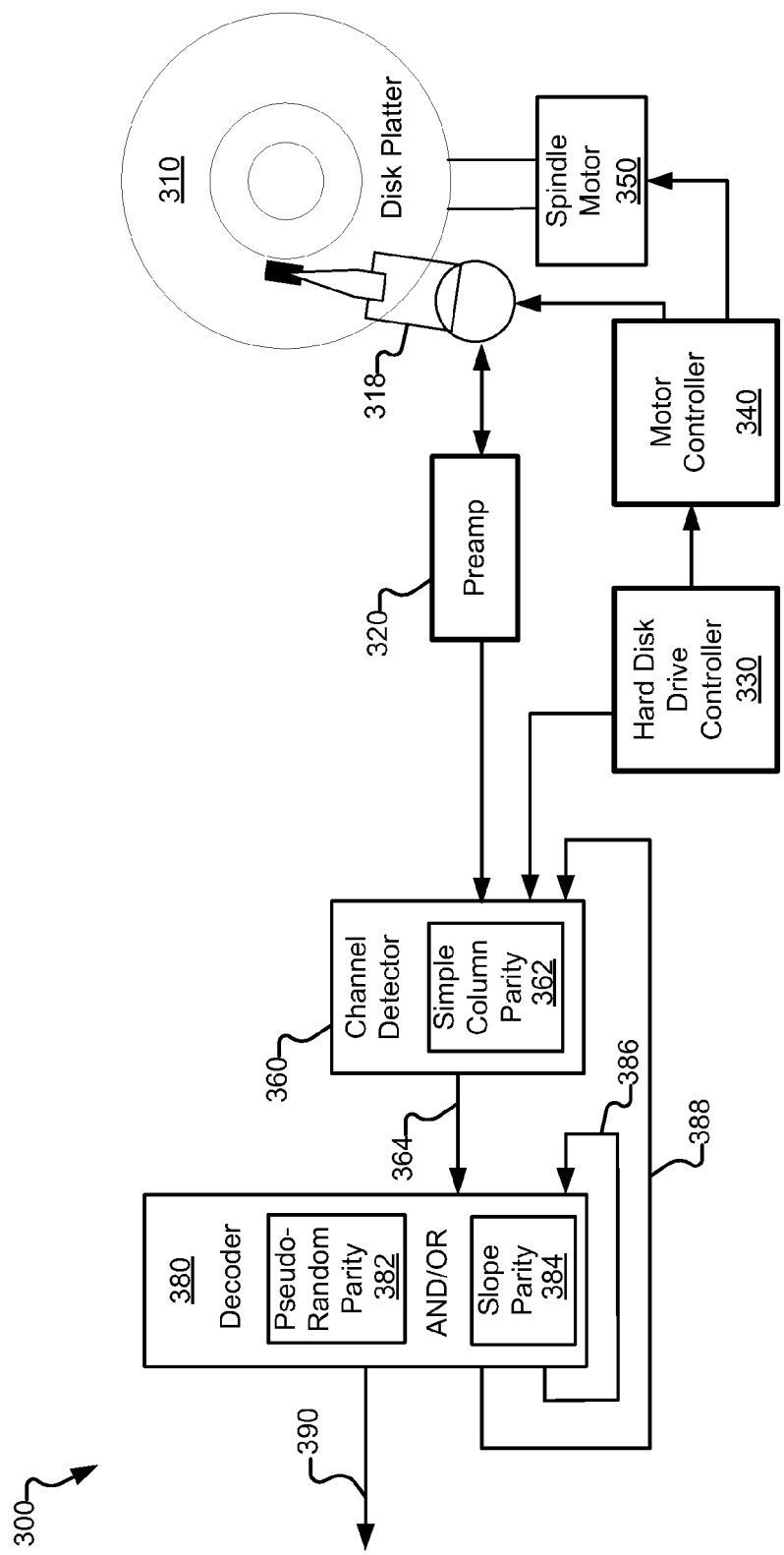
FIG. 4 shows a hard disk drive system incorporating a combination of a channel detector and a decoder in accordance with various embodiments of the present invention.

Turning to FIG. 4, an exemplary embodiment of the present invention is deployed in relation to a hard disk drive system 300. Hard disk drive system 300 includes a disk platter 310 that provides a magnetic storage medium. Hard disk drive system 300 includes a decoder 380 that provides one or both of a pseudo-random parity check 382 and a slope parity check 384, and a channel detector 360 that provide a column parity check 362. An output 364 from channel detector 360 is provided to decoder 380, and an output 390 from decoder 380 is provided to an interface (not shown) of hard disk drive system 300. In addition, an output 386 of decoder 380 is fed back to itself while an output 388 of decoder 380 is fed back to channel detector 360. In addition, hard disk drive system 300 includes a hard disk controller 330, a motor controller 340, a preamp 320, a spindle motor 350, and a read/write head assembly 318.

The data on disk platter 310 consists of groups of magnetic signals that may be detected by read/write head assembly 318 when the assembly is properly positioned over disk platter 310. In a typical read operation, read/write head assembly 318 is accurately positioned by motor controller 340 over a desired data track on disk platter 310. Motor controller 340 both positions read/write head assembly 318 in relation to disk platter 310 and drives spindle motor 350 by moving read/write head assembly to the proper data track on disk platter 310 under the direction of hard disk controller 330. Spindle motor 350 spins disk platter 310 at a determined spin rate (RPMs).

Once read/write head assembly 310 is positioned adjacent the proper data track, magnetic signals representing data on disk platter 310 are sensed by read/write head assembly 318 as disk platter 310 is rotated by spindle motor 350. The sensed magnetic signals are provided as a continuous, minute analog signal representative of the magnetic data on disk platter 310. This minute analog signal is transferred from read/write head assembly 318 to channel detector 360 via preamp 320. Preamp 320 is operable to amplify the minute analog signals accessed from disk platter 310. An analog to digital converter (not shown) digitizes the received analog signal and the combination of decoder 380 and channel detector 360 work on the digitized signal to recreate the digital data originally written to disk platter 310. Channel detector 360 and decoder 380 operate in accordance with one or more of the embodiments discussed above in relation to channel detectors 260, 261 and decoders 280, 281. The digitized data is provided via an interface (not shown) to a host computer or device governing operation of hard disk drive system 300.

Figure 5A:
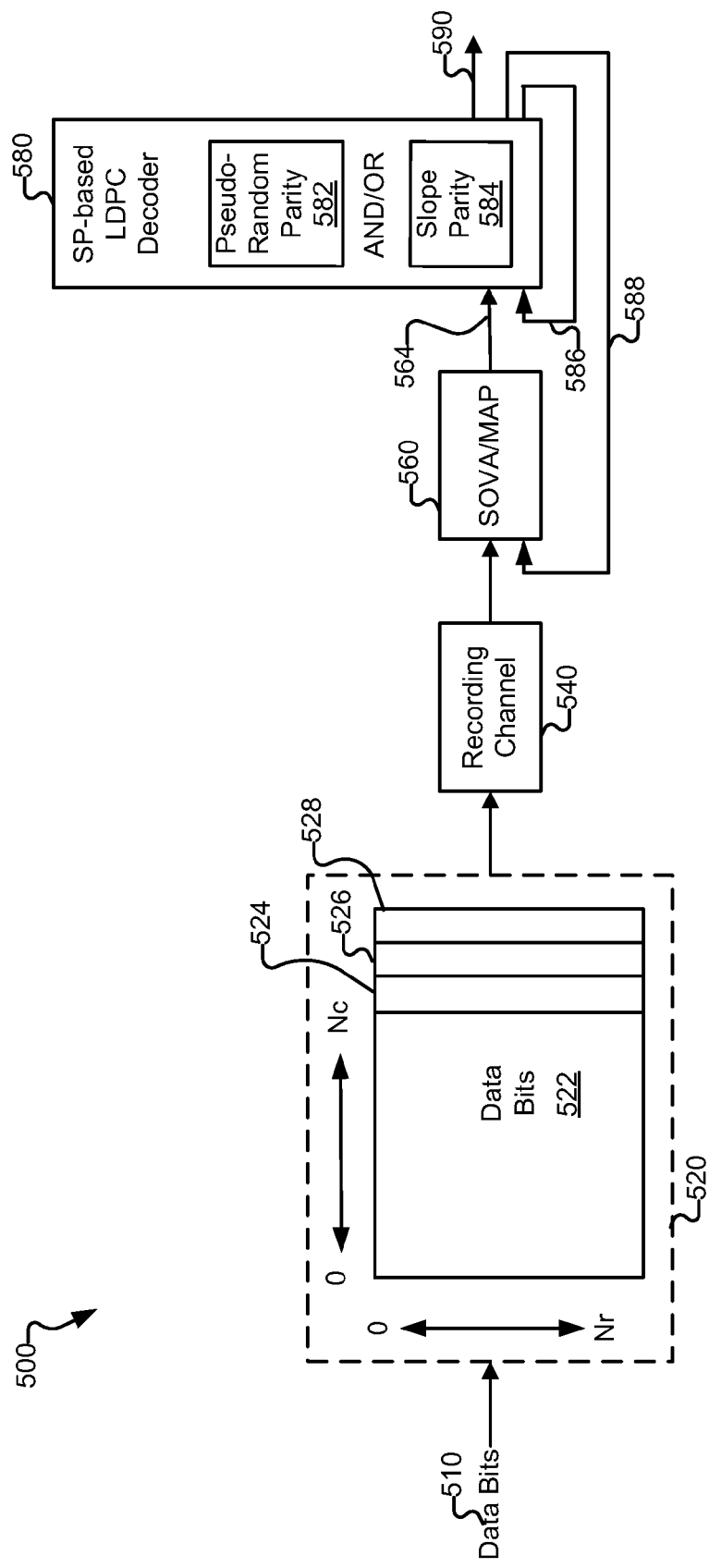
FIGS. 5a-5c together depict a digital recording systems in accordance with various embodiments of the present invention.

Turning now to FIG. 5a, a digital recording system 500 in accordance with various embodiments of the present invention is depicted. Digital recording system 500 includes an encoder 520 capable of receiving an original data set 510 and encoding original data set 510 as a two dimensional data set 522 arranged in a number of columns (Nc) and a number of rows (Nr). It should be noted that two dimensional data set 522 may be rotated ninety degrees such that the rows become vertical and the columns become horizontal. Encoder 520 performs a low density parity check encoding using a three-dimensional single parity encoding algorithm. The first dimension includes a group of parity data arranged as a column 524 of encoded data set 522, the second dimension includes a group of parity data arranged as a column 526 of encoded data 522, and the third dimension includes a group of parity data arranged as a column 528 of encoded data 522.

In some cases of the aforementioned embodiment of the present invention, all three dimensions utilize a slope parity check using a different slope angle for each of the columns 524, 526, 528 of parity data. In other cases of the aforementioned embodiment of the present invention, all three dimensions utilize a pseudo-random parity check for each of the columns 524, 526, 528 of parity data. In yet other cases of the aforementioned embodiment of the present invention, the three dimensions are some combination of slope parity check(s) and pseudo-random parity check(s). In some cases of the aforementioned embodiment even parity is used, while in other cases odd parity is used.

Once the encoding process is complete, encoded data set 522 of size (Nr) rows and (Nc+3) columns are written to a disk by recording channel 540 on a column by column basis. At this juncture it should be noted that one of ordinary skill in the art upon reading this disclosure will recognize that writing the data to disk may be done on another basis such as, for example, a row by row basis if such was desired and the appropriate accommodations were made. Further, based on reading this disclosure, one of ordinary skill in the art will recognize that the process of writing to disk may be replaced by another transmission activity depending upon the system in which the embodiments of the present invention are being deployed. Thus, for example, where the particular embodiment of the present invention is being deployed in a wireless communication system, recording channel 540 may be replaced by a transmitter and a receiver. In such cases, rather than the action of writing to disk, the action may include transmitting encoded data set 522. The encoded data set would then be received by a receiver, rather than accessed from a disk. Again, based on the disclosure provided herein, one of ordinary skill in the art will recognize a variety of other applications in which embodiments of the present invention may be deployed, and actions applied to encoded data set 522 based on the particular application.

At some point the written encoded data 522 is accessed from the disk by recording channel 540 and provided to a channel detector 560. Channel detector 560 may be any soft input/soft output channel detector such as, for example, a SOVA (Soft Output Viterbi Algorithm Decoder) or MAP (Maximum A Posteriori Probability) channel detector as are known in the art. Channel detector 560 provides an output 564 to a decoder 580. In some cases, decoder 580 is a simple parity based LDPC decoder. In some embodiments of the present invention, output 264 includes a soft output (i.e., reliability information). In some cases, where the soft output has not exceeded a predetermined reliability threshold, it is fed back to channel detector 560 as an output 588 from decoder 580. In particular cases, the soft output is increased by application of error detection/error correction implemented by decoder 580 as discussed below. In other cases, the soft output is simply fed back to channel detector 560 without modification where it is used it is used as a priori information for further refinement in determining an increased reliability factor. It should be noted that such feedback is optional and in some cases may be replaced by a series of decoding stages as more fully discussed below in relation to FIG. 6.

Decoder 580 includes a pseudo-random parity check 582 and/or a slope parity check 584 depending upon how data bits 510 are encoded. For example, in one particular case, slope parity check 284 operates on the parity information contained in columns 524, 526, 528. In such cases, pseudo-random parity check 582 may not be included in decoder 580. Decoder 580 provides an output 590 that in some cases includes a soft output (i.e., reliability information). In some cases, where the soft output has not exceeded a predetermined reliability threshold, it is fed back to decoder 580 as an output 586 from decoder 580. Thus, the reliability information may be iteratively used to detect and/or correct any errors in encoded data set 522. It should be noted that such feedback is optional and in some cases may be replaced by a series of decoding stages as more fully discussed below in relation to FIG. 6. As one of various advantages, digital recording system 500 provides a significant gain in signal to noise ratio when compared with other encoding/decoding architectures, yet requires only a moderate increase in design complexity when compared with the same architectures. It should be noted that digital recording system 500 can be used in relation to hard disk drive system 300. In particular, channel detector 560 may be used in place of channel detector 360, and SP-based LDPC decoder 580 may be used in place of decoder 380.

Figure 5B:
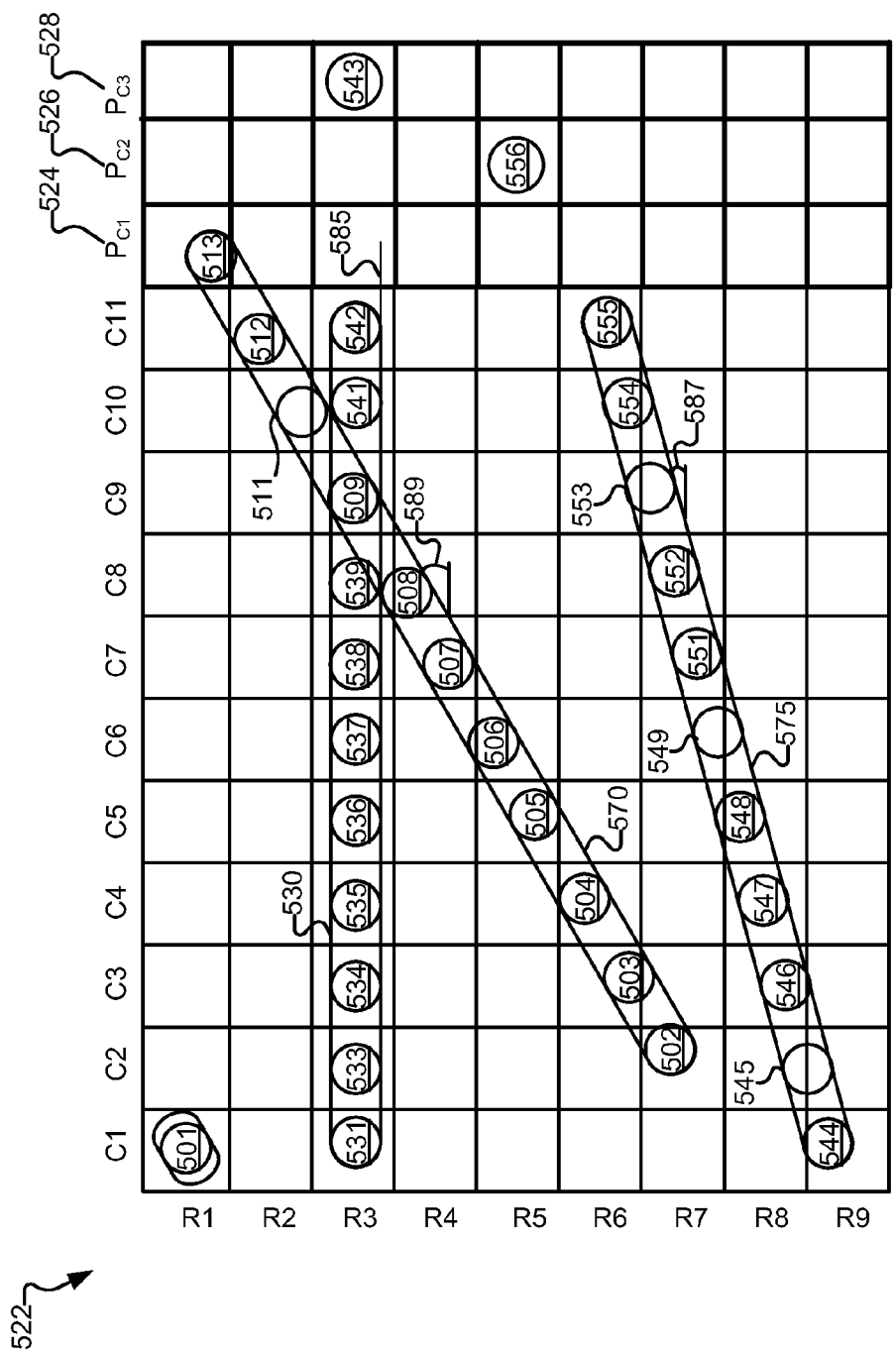
Figure 5C:
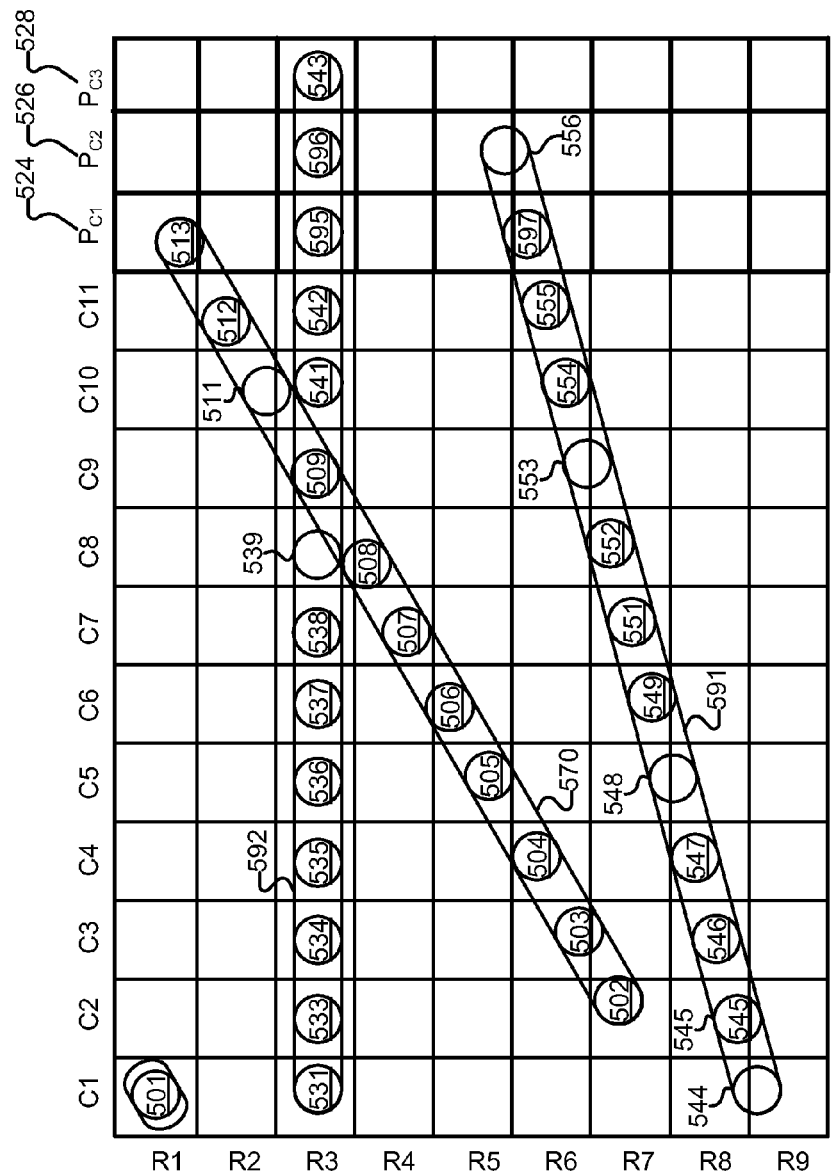

FIGS. 5b and 5c show two exemplary slope encodings of an exemplary data set 522. As shown, exemplary data set 522 includes eleven columns (C1-C11) and nine rows (R1-R9) of encoded data. In addition, column 524 of nine slope parity bits, column 526 of nine slope parity bits, and column 528 of nine slope parity bits are included. Each of the bits in columns 524, 526, 528 is associated with a respective group 570, 575, 530 of data bits traversing encoded data 522 at a given angle. In some cases, this includes one bit from each column of encoded data 522. As just one example, a parity bit 513 in column 524 is associated with a group of data bits including a data bit 501 from column C1, a data bit 502 from column C2, a data bit 503 from column C3, a data bit 504 from column C4, a data bit 505 from column C5, a data bit 506 from column C6, a data bit 507 from column C7, a data bit 508 from column C8, a data bit 509 from column C9, a data bit 511 from column C10, a data bit 512 from column C11. Other parity bits within column 524 are associated with similar diagonal groups of parity bits traversing encoded data set 522 at an angle 589 such that all bits in encoded data set 522 are used in the parity checking scheme. As a simple example, where angle 589 is zero, each row (R1-R9) are associated with a respective parity bits in column 524. In one particular embodiment of the present invention, angle 589 is programmable such that different groupings of data associated with a given parity bit can be achieved. It should be noted that diagonal, horizontal, and anti-diagonal slopes may be defined in any given data set. In the case depicted in FIG. 5b, the parity bits included within the diagonal are not included in any other slope parity check (i.e., there is one parity bit included in each group 570, 575, 530).

Continuing the example, a parity bit 556 in column 526 is associated with a group of data bits including a data bit 544 from column C1, a data bit 545 from column C2, a data bit 546 from column C3, a data bit 547 from column C4, a data bit 548 from column C5, a data bit 549 from column C6, a data bit 551 from column C7, a data bit 552 from column C8, a data bit 553 from column C9, a data bit 554 from column C10, and a data bit 555 from column C11. The preceding group traverses encoded data set 522 at an angle 587. Other parity bits within column 526 are associated with similar diagonal groups of parity bits traversing encoded data set 522 at angle 587 such that all bits in encoded data set 522 are used in the parity checking scheme. A parity bit 543 in column 528 is associated with a group of data bits including a data bit 531 from column C1, a data bit 533 from column C2, a data bit 534 from column C3, a data bit 535 from column C4, a data bit 536 from column C5, a data bit 537 from column C6, a data bit 538 from column C7, a data bit 539 from column C8, a data bit 509 from column C9, a data bit 541 from column C10, and a data bit 542 from column C11. The preceding group traverses encoded data set 522 at an angle 585. Other parity bits within column 528 are associated with similar diagonal groups of parity bits traversing encoded data set 522 at angle 585 such that all bits in encoded data set 522 are used in the parity checking scheme.

Turning to FIG. 5c, a similar set of diagonal groups of parity bits is depicted. In this case, however, multiple parity bits are included in the diagonal groups. In particular, a group 592 includes all of the data bits included with the aforementioned group 530. In addition, group 592 includes a parity bit 595 from column 524 and a parity bit 596 from column 526. Parity bit 543 operates as a simple parity bit for group 592 with parity bit 595 and parity bit 596 being treated the same as the other data bits for the purposes of the parity calculation for group 592. A group 591 includes all of the data bits included with the aforementioned group 575. In addition, group 591 includes a parity bit 597 from column 524. Parity bit 556 operates as a simple parity bit for group 591 with parity bit 597 being treated the same as the other data bits for the purposes of the parity calculation for group 591. Based on the disclosure provided herein, one of ordinary skill in the art will recognize that encoding the data set discussed in FIG. 5c is somewhat more complex that encoding that of FIG. 5b. Further, one of ordinary skill in the art will recognize that an iterative encoding may be performed where each of the diagonal groups may include three parity bits. In such cases, only the parity bit in the column associated with the group acts as a simple parity bit with the other parity bits being treated similar to the data bits. Yet further, based on the disclosure provided herein, one of ordinary skill in the art will recognize that columns 524, 526, 528 may be associated with groups of pseudo-random bits, or a combination of diagonal groups and pseudo-random groups.

It should be noted that the number of columns and rows depicted in FIGS. 5b and 5c is merely exemplary. Based on the disclosure provided herein, one of ordinary skill in the art will appreciate a variety of other column and row dimensions that may be used to achieve desired design constraints. For example, the data may be arranged in a 4×4 array plus two added parity columns and an added parity row. In some embodiments of the parity check matrix is not maintained in hardware, but rather can be calculated from the included interleavers. Further, the code length, rate, column weight of the parity check matrix, and/or the slope can be programmable. Such embodiments provide a great deal of programmability that can be tailored to meet a particular circumstance.

Figure 6:
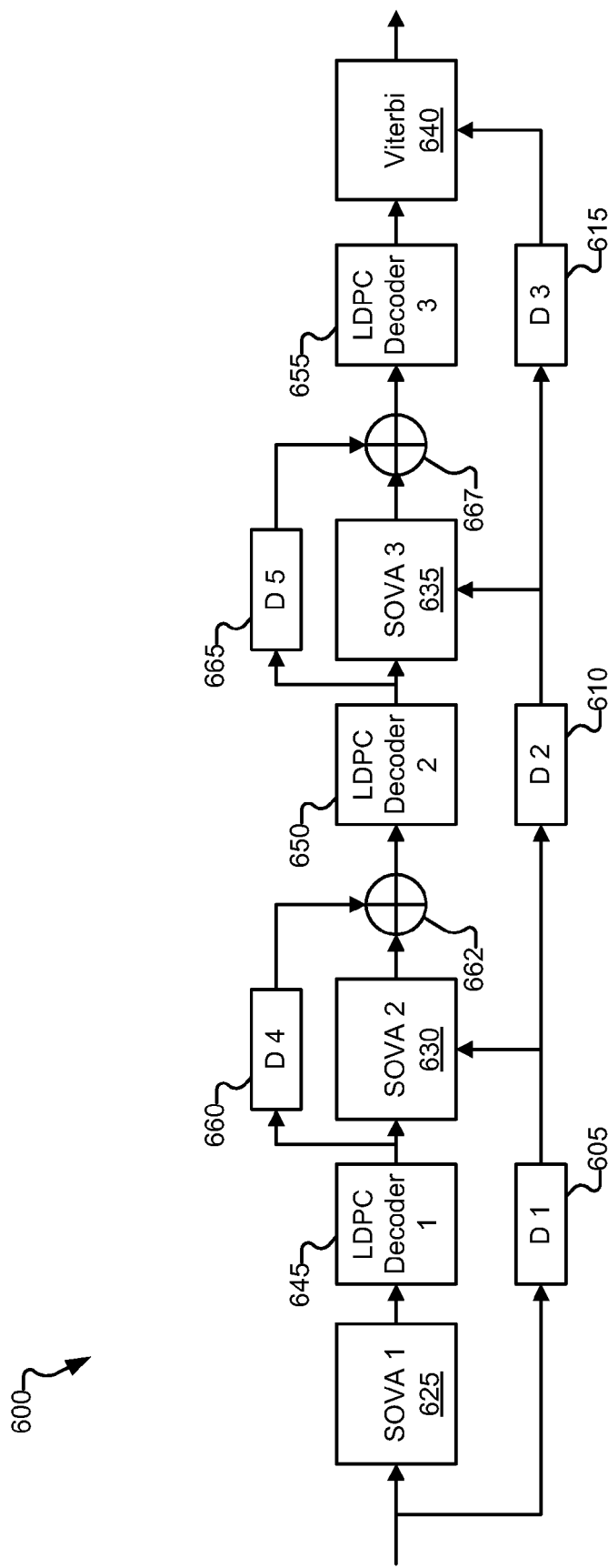
FIG. 6 shows a series of decoding stages in accordance with some embodiments of the present invention that may be implemented using the decoding systems of FIGS. 2 and 5.

Turning to FIG. 6, a system 600 in accordance with one or more embodiments of the present invention is disclosed. System 600 includes a series of four stages with the first stage including a channel detector 625, an LDPC decoder 645, and a delay 605. The second stage includes a channel detector 630, a delay 660, a summer 662, an LDPC decoder 650, and a delay 610. The third stage includes a channel detector 635, a delay 665, a summer 667, an LDPC decoder 655, and a delay 615. The fourth stage includes a hard output Viterbi decoder 640. System 600 shows a general iterative system into which decoder 280 and channel detector 260 may be deployed in place of the respective channel detectors and LDPC decoders of the various stages. Alternatively, decoder 281 and channel detector 261 may be deployed in place of the respective channel detectors and LDPC decoders of the various stages. As yet another alternative, decoder 580 and channel detector 560 may be deployed in place of the respective channel detectors and LDPC decoders of the various stages. Thus, such an iterative approach may be applied in relation to a number of embodiments of the present invention.

Figure 7A:
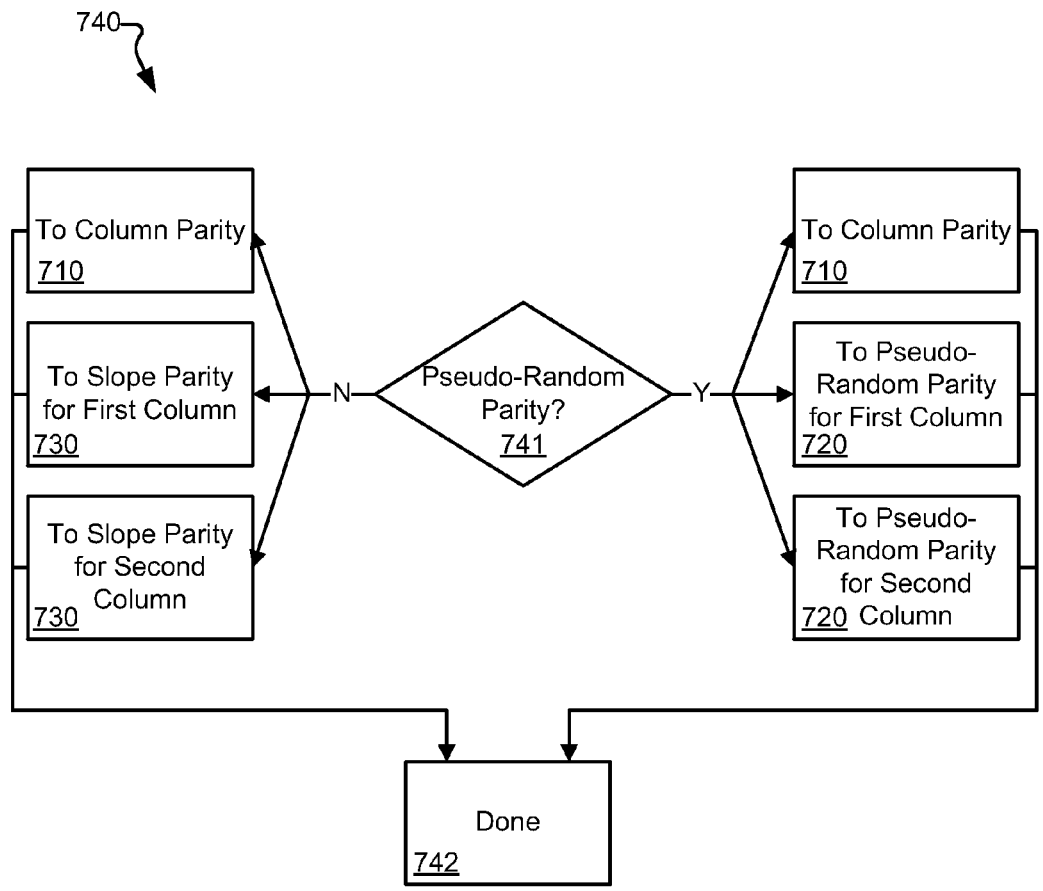
FIGS. 7a-7c show various encoding methods that may be used in accordance with one or more embodiments of the present invention.
Figure 7B:
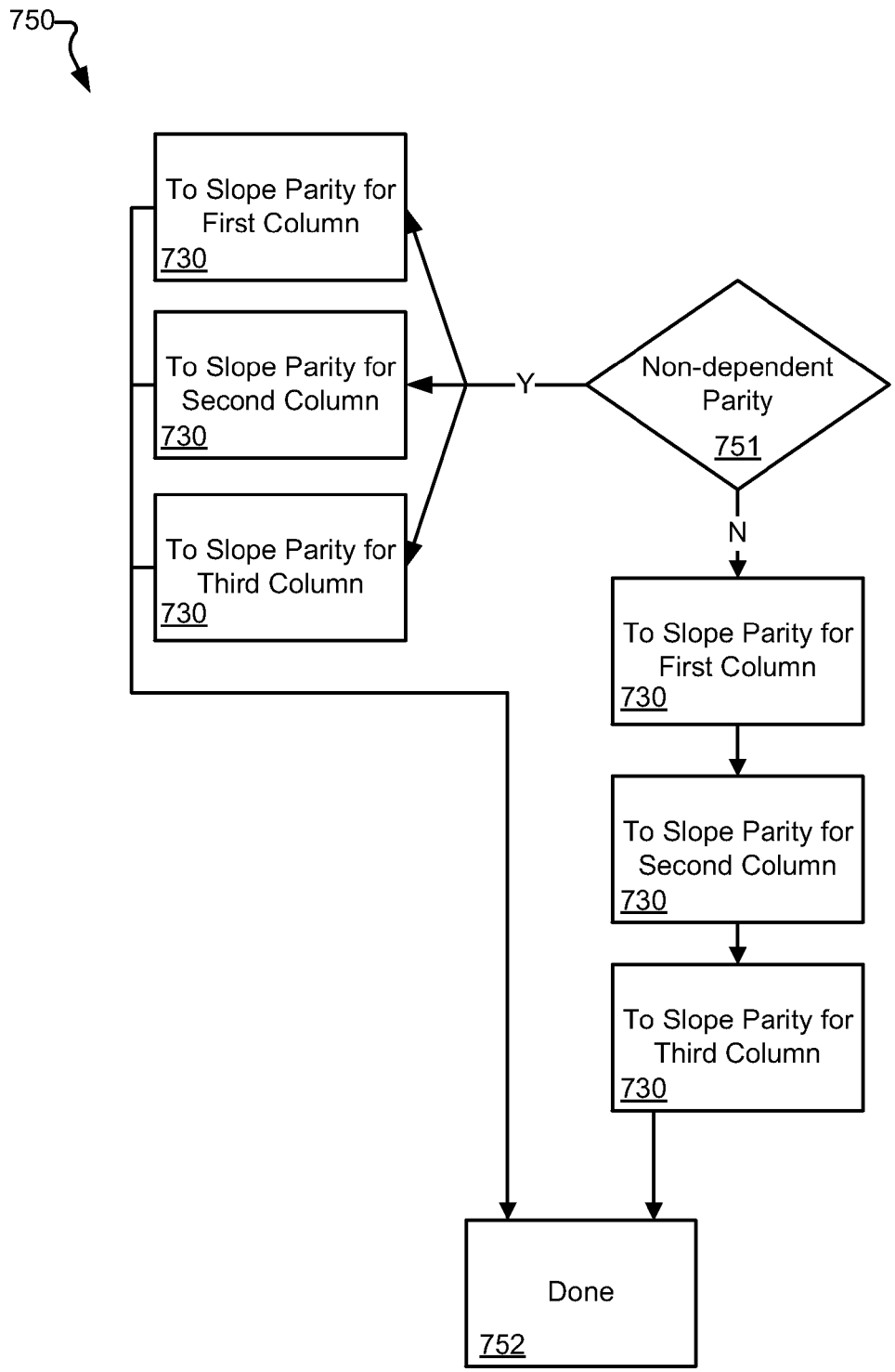
Figure 7C:
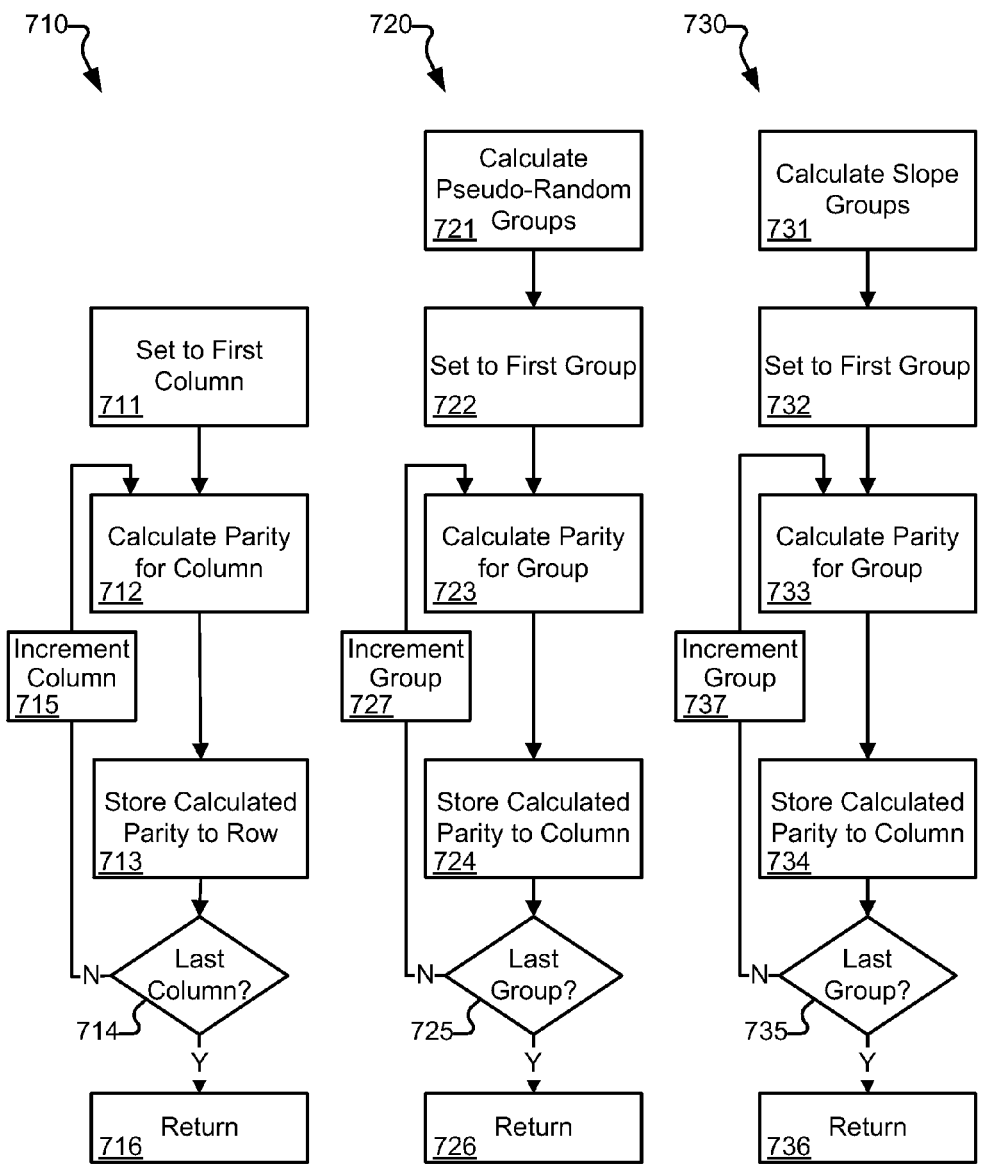

Turning to FIGS. 7a-7c, flow diagrams 740, 750 depict exemplary embodiments for encoding data sets in accordance with one or more embodiments of the present invention. In particular, flow diagram 740 shows a method for encoding data sets such as those shown in FIGS. 2c and 2d. It is determined whether column 226 and column 228 are to be encoded as slope parity or pseudo-random parity (block 741). Where slope parity is to be used for both columns (block 741), a column parity module 710 is called to calculate column parity for each column of data set 222. In addition, two instances of a slope parity module 730 are called in parallel with one tasked with calculating slope parity associated with column 226 and the other tasked with calculating slope parity associated with column 228. Alternatively, where pseudo-random parity is to be used for both columns (block 741), column parity module 710 is called to calculate column parity for each column of data set 222. In addition, two instances of a pseudo-random parity module 720 are called in parallel with one tasked with calculating pseudo-random parity associated with column 226 and the other tasked with calculating pseudo-random parity associated with column 228. Each of column parity module 710, pseudo-random parity module 720, and slope parity module 730 are discussed in more detail below in relation to FIG. 7c below. Once the modules have completed, the encoding process is completed (block 742). Based on the disclosure provided herein, one of ordinary skill in the art will appreciate that flow diagram 740 can be modified to allow for calculating pseudo-random parity for one of the columns and slope parity for the other column.

Flow diagram 750 shows a method for encoding data sets such as those shown in FIGS. 5b and 5c. It is determined whether columns 524, 526, 528 are to be encoded as dependent or non-dependent parity (block 751). As used in this example, non-dependent parity implies a single parity bit included in each of groups 530, 570, 575 as shown in FIG. 5b.

In contrast, dependent parity implies a single parity bit for one group, two parity bits for the next group (one of the parity bits being treated similar to the data bits), and three parity bits for the last group (two of the parity bits being treated similar to the data bits). Where non-dependent parity is to be used (block 751), three instances of slope parity module 730 are called in parallel with one tasked with calculating slope parity associated with column 524, another tasked with calculating slope parity associated with column 526, and the other tasked with calculating slope parity associated with column 528. Once the modules complete, the encoding is done (block 752). Of note, parity for each of the columns can be calculated in parallel making encoding relatively fast.

Alternatively, where dependent parity is to be used (block 751), an instance of slope parity module 730 is called to calculate slope parity associated with column 524. Then, once column 524 is complete, an instance of slope parity module 730 is called to calculate slope parity associated with column 526 that includes the parity data of column 524 (similar to that discussed in relation to FIG. 5c above). Then, once column 526 is complete, an instance of slope parity module 730 is called to calculate slope parity associated with column 528 that includes the parity data of column 524 and column 526 (similar to that discussed in relation to FIG. 5c above). Once the modules complete, the encoding is done (block 752). Such encoding takes additional time when compared to the aforementioned parallel example, but may result in a more robust code.

Turning to FIG. 7c, flow diagrams representing column parity module 710, pseudo-random parity module 720 and slope parity module 730 are shown. Following the flow diagram associated with column parity module 710, a pointer is set to the first column of a data set (block 711), and the parity for the column is calculated by accounting for each data bit within the column (block 712). The calculated parity is stored to a parity row (block 713). It is determined whether the last parity calculated was for the last column of the data set (block 714). If it is not the last column (block 714), the column pointer is incremented (block 715) and the parity calculation and storage is repeated for the next column (blocks 712, 713). This process continues until parity for all columns is calculated and stored at which time the module completes and returns (block 716).

Following the flow diagram associated with pseudo-random parity module 720, groups of pseudo random bits associated with each parity bit are calculated (block 721) and a pointer is set to the first group (block 722). Parity for the group is by accounting for each data bit within the group (block 723). The calculated parity is stored to a parity column (block 724). It is determined whether the current parity calculation was for the last group of the data set (block 725). If it is not the last group (block 725), the group pointer is incremented (block 727) and the parity calculation and storage is repeated for the next group (blocks 723, 724). This process continues until parity for all groups is calculated and stored at which time the module completes and returns (block 726).

Following the flow diagram associated with slope parity module 730, diagonal groups of bits associated with each parity bit are calculated (block 731) and a pointer is set to the first group (block 732). Parity for the group is by accounting for each data bit within the group (block 733). The calculated parity is stored to a parity column (block 734). It is determined whether the last parity calculated was for the last group of the data set (block 735). If it is not the last group (block 735), the group pointer is incremented (block 737) and the parity calculation and storage is repeated for the next group (blocks 733, 734). This process continues until parity for all groups is calculated and stored at which time the module completes and returns (block 736).

One or more embodiments of the present invention include the possibility of creating error checking dependencies in the encoding process. For example, when encoding data set 522 as discussed in relation to flow diagram 750 above, there is possibility of a data dependency occurring. Such data dependence undermines a robust code as each check is no longer independent. The shortest path length that can be achieved without a cycle is referred to as girth. The longer the girth, the less the data dependency and the more robust the code. In general, a code is defined by a minimum distance (dmin) value and a girth value. As will be appreciated by one of ordinary skill in the art upon reading this disclosure, dmin affects the code performance in the maximum-likelihood (ML) decoding, and the girth affects primarily belief propagation. It is widely accepted that the belief-propagation decoding provides the best approximation of maximum-likelihood decoding where a given code does not exhibit cyclical dependencies.

Figure 8A:
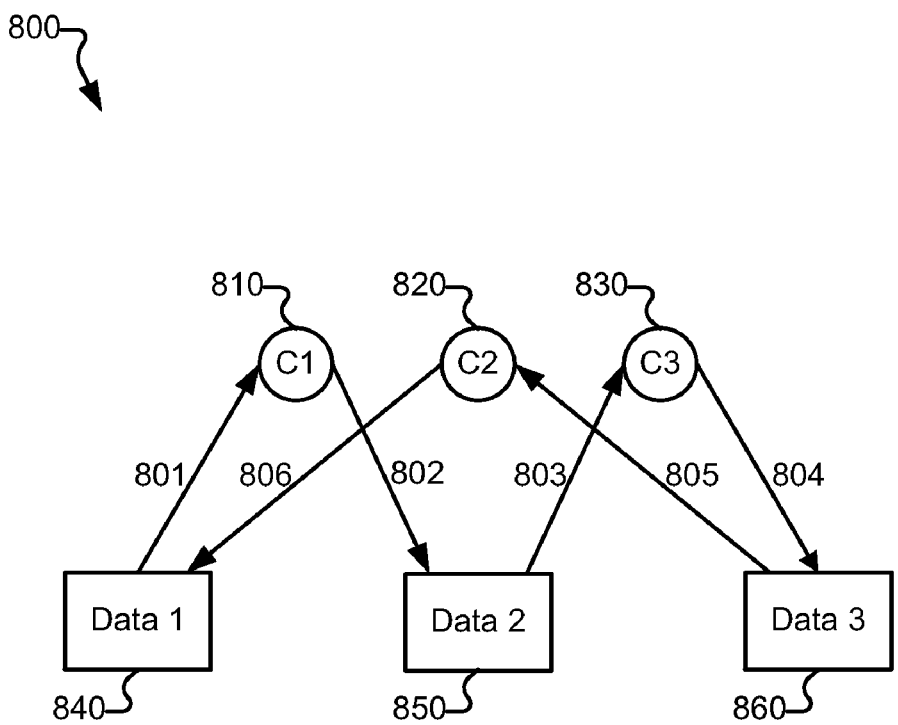
FIGS. 8a-8c show a method for encoding a girth eight code in accordance with one or more embodiments of the present invention.

Turning to FIG. 8a, a lattice diagram 800 depicts a six path data dependency involving three data bits 840, 850, 860 and three checks 810, 820, 830. Following lattice diagram 800, data bit 840 is check along with a group of other bits by a check 810 as shown by a path 801. The result of check 810 is used in relation to data bit 850 and other data bits which are checked by check 820 as shown by paths 802, 803. The result of check 820 is used in relation to data bit 860 and other data bits which are checked by check 820 as shown by paths 804, 805. The result of check 820 is fed forward to check data bit 840 as shown by path 806. Thus, the value ascertained for data bit 840, data bit 850 and data bit 860 is each ultimately dependent upon itself. This dependency diminishes the ability for any code to effectively predict the value of data bit 840, data bit 850 and data bit 860.

Figure 8B:
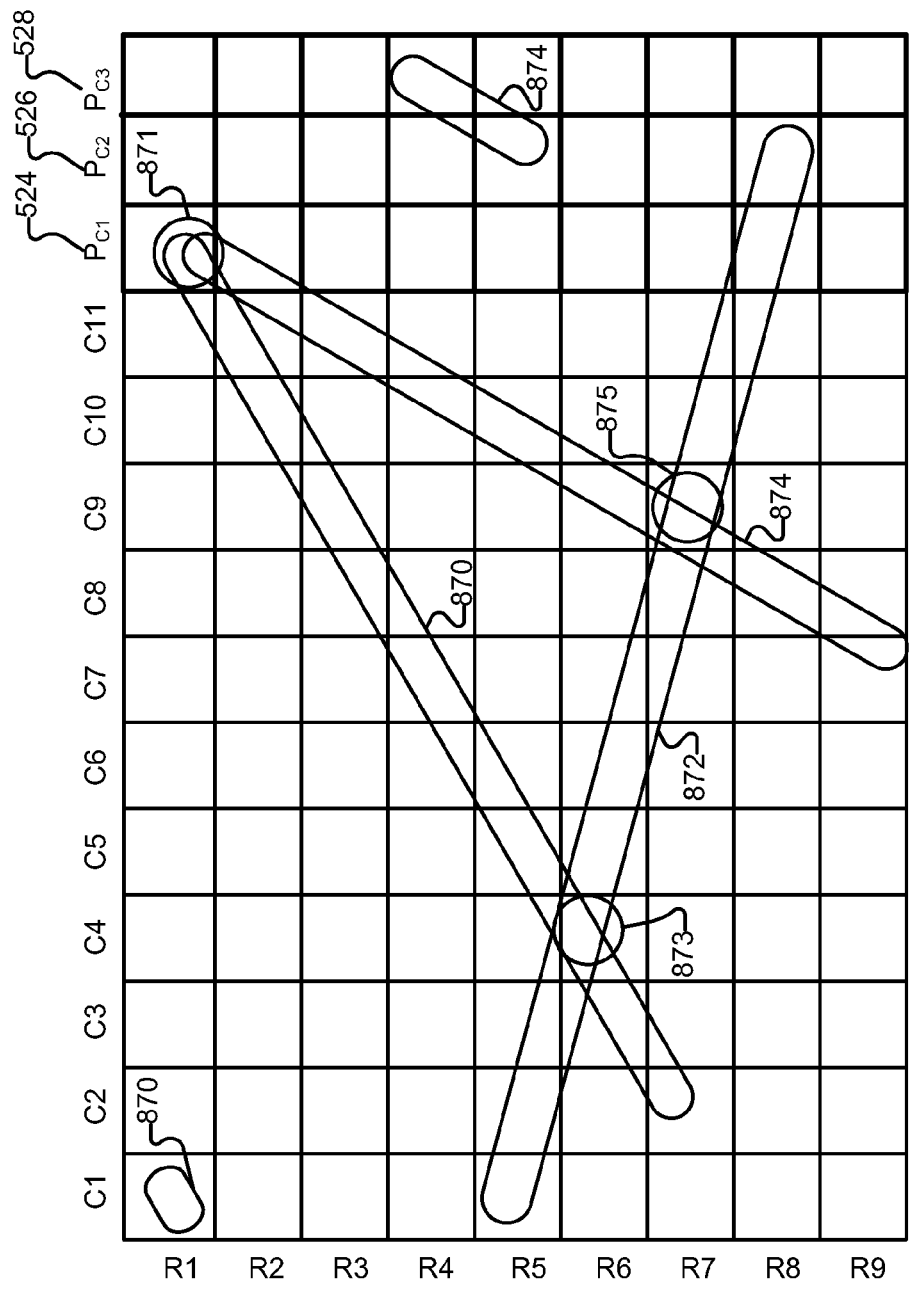

The preceding dependency is illustrated in FIG. 8b in relation to an encoded data set 822 that includes three columns of parity 824, 826, 828. Three diagonal groups of bits 870, 872, 874 are defined in encoded data set 822. The three groups share common data bits 871, 873, 875 that are located at the intersections of the three groups. Thus, groups 870, 872, 874 form a triangle with data bits 871, 873, 875 located at the respective corners of the triangles. Such a configuration results in each of data bits 871, 873, 875 being the subject of checks (parity checks using the parity bits in columns 824, 826, 828) common to other of bits 871, 873, 875. This results in the dependency discussed above in relation to lattice diagram 800. In particular, data 840 is represented by data bit 871, data 850 is represented by data bit 873, data 860 is represented by data bit 875, check 810 is represented by the parity check of group 870, check 820 is represented by the parity check of group 874, and check 830 is represented by the parity check of group 872.

Some embodiments of the present invention provide a code design technique that may be used to reduce a six path dependency (or triangle dependency) such as that illustrated by FIGS. 8a and 8b. In some cases, a code of weight three is desired because they offer good performance in perpendicular recording scenarios. In such cases, an algorithm designed to avoid a triangular pattern such as that shown in FIG. 8b may be applied. Such an approach may provide for flexibility of designing both high rate and low rate codes. Such high rate codes may be of particular interest in magnetic recording.

Figure 8C:
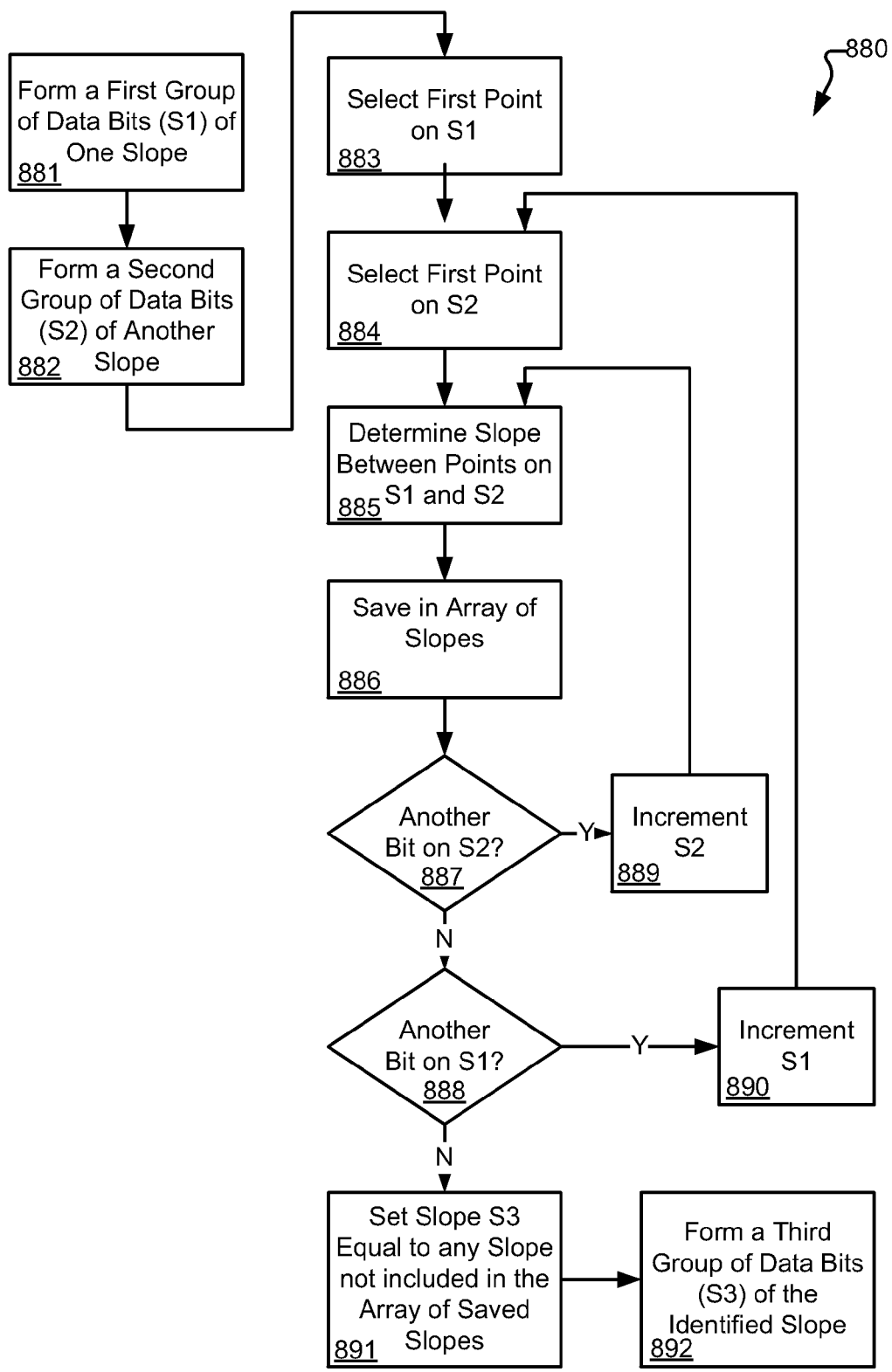

Turning to FIG. 8c, a flow diagram 880 depicts a method in accordance with one or more embodiments of the present invention for avoiding the aforementioned dependencies. Following flow diagram 880, one group of data bits (S1) traversing a data set at an angle or slope is defined (block 881), and another group of data bits (S2) traversing the same data set at another angle is defined (block 882). These could include, for example, groups 870, 874 of FIG. 8b along with the other groups traversing data set 822 at the same angle as groups 870, 874. A first bit location (i.e., point) on the S1 group of data bits is selected (block 883) and a first bit location (i.e., point) on the S2 group of data bits is selected (block 884). The slope between the selected bit locations is then determined (block 885), and the determined slope is saved in an array of slopes (block 886). This process is repeated until a slope from every one of the bits included in S1 to every bit in S2 is calculated (blocks 887, 888, 889, 890). Once all of the slopes are calculated, a slope for the third group of bits is defined (block 891). The slope for the third group of bits may be defined as any slope not included in the array of saved slopes. This will assure that a triangular pattern such as that shown in FIG. 8b will not occur. A third group of bits (S3) is then formed using the determined slope (block 892). This may include forming a number of groups of bits each having the determined slope until all of the bits in a given array of bits are accounted for. Once this is complete, parity such as that described above in relation to FIGS. 5a-5c may be calculated.

Of note, such an approach allows for the minimum distance (dmin) and girth values for the code to be controlled. Further, based on the disclosure provided herein, one of ordinary skill in the art will recognize that the processes may be extended to obtain codes of girth ten and girth 12 and on. Further, such an approach may be used in accordance with one or more embodiments of the present invention to design a simple type of LDPC codes of girth eight. Such LDPC codes can be used in digital storage, transmission systems, and/or the like. By encoding and reproducing information with the proposed LDPC code, it is possible to obtain a high correcting effect, which decreases random and burst errors even at low signal to noise ratios. LDPC codes developed using the aforementioned technique generally offer good performance, flexibility and/or reduced complexity when compared to Randomly generated LDPC codes which exhibit relatively high decoding/encoding complexity; LDPC codes created using cyclic matrix permutation that are typically offer relatively low encoding complexity, but are typically not very flexible in terms of column/row weight of the parity-check matrix, as well as code length and rate; and LDPC codes based on rectangular integer lattices guarantee minimum distance of greater than or equal to six and a girth of eight. However, the code rate and length are difficult to control.

Figure 9:
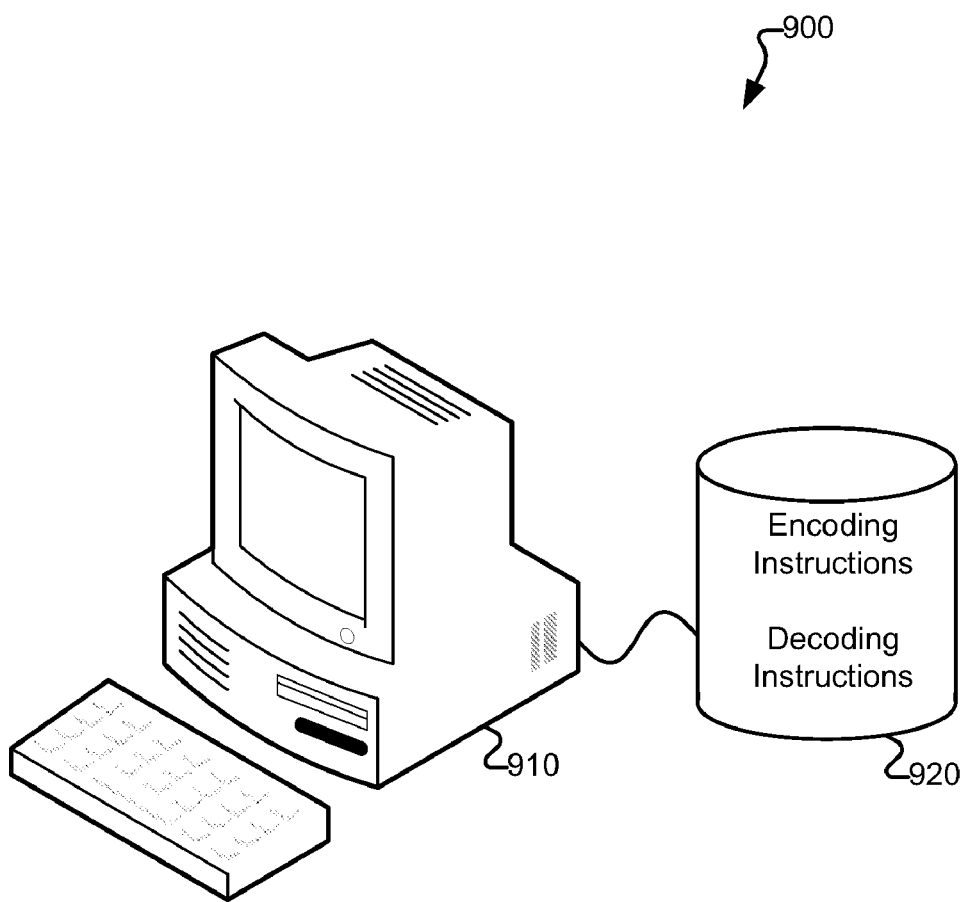
FIG. 9 depicts a software based system 900 in accordance with one or more embodiments of the present invention.

Turning to FIG. 9, a software based system 900 in accordance with one or more embodiments of the present invention is depicted. Software based system 900 includes a processor based machine 910 and a computer readable medium 920 that includes software or firmware (i.e., instructions executable by a processor) to performing part of or all of the encoding and/or decoding functions described herein. As will be appreciate by one of ordinary skill in the art upon reading this disclosure, processor based machine 910 may include any type of processor capable of executing software and/or firmware instructions. Thus, for example, processor based machine 910 may include a microprocessor or a digital signal processor. Alternatively, processor based machine 910 may simply be a microprocessor or a digital signal processor that is imbedded with other logic. Further, based on the disclosure provided herein, one of ordinary skill in the art will recognize that computer readable medium 920 may be any number of storage devices including, but not limited to, a hard disk drive, a random access memory, a non-volatile memory, and/or the like. As just some examples, instructions maintained on computer readable medium 920 may be executable to perform one or more of the functions of channel detector 260, decoder 280, encoder 220, channel detector 261, decoder 281, channel detector 360, decoder 380, channel detector 560, decoder 580, flow diagram 740, flow diagram 750, and/or flow diagram 880.

Figure 10:
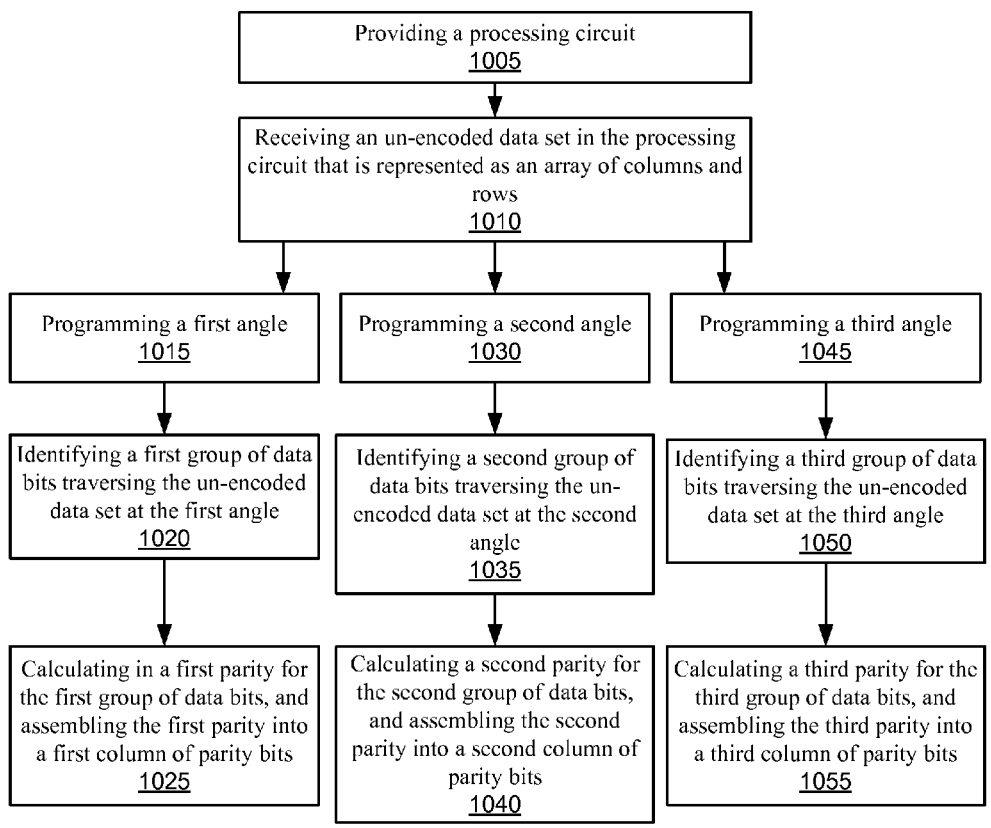
FIG. 10 is a flow diagram showing a method in accordance with one or more embodiments of the present invention.

Turning to FIG. 10, a flow diagram 1000 shows a method in accordance with one or more embodiments of the present invention. Following flow diagram 1000, a processing circuit is provided (block 1005). An un-encoded data represented as an array of columns and rows is received by the processing circuit (block 1010). At least one of a first angle, a second angle and a third angle are programmed (block 1015, block 1030, and block 1045). In some cases, the first angle is different from at least one of the second angle and the third angle. In various cases, the first angle is the same as at least one of the second angle and the third angle. In one or more cases, the first angle is different from the second angle and different from the third angle. In some cases, the slope of at least one of the first angle, the second angle and the third angle may be: a slope greater than zero, a slope less than zero, or a slope equal to zero. In various cases, the data set is represented as columns and rows, and the slope parity checks operate on at least one element from each of the columns. A first group of data bits traversing the un-encoded data set at the first angle is identified (block 1020), and a first parity for the first group of data bits is calculated and assembled into a first column of parity bits (block 1025). In some cases, the first group of data bits includes one data bit from each column of the un-encoded data set. A second group of data bits traversing the un-encoded data set at the second angle is identified (block 1035), and a second parity for the second group of data bits is calculated and assembled into a second column of parity bits (block 1040). A third group of data bits traversing the un-encoded data set at the third angle is identified (block 1050), and a third parity for the third group of data bits is calculated and assembled into a third column of parity bits (block 1055). In some cases, calculating the first parity is exclusive of the second parity and exclusive of the third parity, calculating the second parity is exclusive of the first parity and exclusive of the third parity, and calculating the third parity is exclusive of the first parity and the second parity. In other cases, calculating the third parity includes using the first parity and the second parity, and/or calculating the second parity includes using the first parity, but is exclusive of the third parity.

In conclusion, the present invention provides novel systems, devices, methods and arrangements for error reduction. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method for data encoding, the method comprising:
 receiving an un-encoded data set in a processing circuit, wherein the un-encoded data set is represented as an array of columns and rows;
 identifying a first group of data bits traversing the un-encoded data set at a first angle;
 identifying a second group of data bits traversing the un-encoded data set at a second angle;
 identifying a third group of data bits traversing the un-encoded data set at a third angle;
 calculating in the processing circuit a first parity for the first group of data bits, and assembling the first parity into a first column of parity bits;
 calculating a second parity for the second group of data bits, and assembling the second parity into a second column of parity bits; and
 calculating a third parity for the third group of data bits, and assembling the third parity into a third column of parity bits.

2. The method of claim 1, wherein the first group of data bits includes one data bit from each column of the un-encoded data set.

3. The method of claim 1, wherein calculating the first parity is exclusive of the second parity and exclusive of the third parity, wherein calculating the second parity is exclusive of the first parity and exclusive of the third parity, and wherein calculating the third parity is exclusive of the first parity and the second parity.

4. The method of claim 1, wherein calculating the third parity includes using the first parity and the second parity.

5. The method of claim 4, wherein calculating the second parity includes using the first parity, but is exclusive of the third parity.

6. The method of claim 1, wherein the method further comprises:
 providing the processing circuit, wherein the processing circuit is operable to perform: the receiving the un-encoded data set, the identifying the first group of data bits traversing the un-encoded data set at a first angle, the identifying a second group of data bits traversing the un-encoded data set at the second angle, the identifying the third group of data bits traversing the un-encoded data set at the third angle, the calculating the first parity for the first group of data bits, and assembling the first parity into the first column of parity bits, the calculating a second parity for the second group of data bits, and assembling the second parity into the second column of parity bits, and the calculating the third parity for the third group of data bits, and assembling the third parity into the third column of parity bits.

7. The method of claim 1, wherein the first angle is different from at least one of the second angle and the third angle.

8. The method of claim 1, wherein the first angle is the same as at least one of the second angle and the third angle.

9. The method of claim 1, wherein the first angle is different from the second angle and different from the third angle.

10. The method of claim 1, wherein the slope of at least one of the first angle, the second angle and the third angle are selected from a group consisting of: a slope greater than zero, a slope less than zero, and a slope equal to zero.

11. The method of claim 1, wherein the method further includes programming at least one of the first angle, the second angle, or the third angle.

12. The method of claim 1, wherein the data set is represented as columns and rows, and wherein the slope parity checks operate on at least one element from each of the columns.

13. A method for error reduction in a digital information system, the method comprising:
 providing an encoder circuit, wherein the encoder circuit is operable to:
  receive an un-encoded data set represented as an assay of columns and rows;
  identify a first group of data bits traversing the un-encoded data set at a first angle;
  identify a second group of data bits traversing the un-encoded data set at a second angle;

identify a third group of data bits traversing the un-encoded data set at a third angle;
calculate a first parity for the first group of data bits, and assemble the first parity into a first column of parity bits;
calculate a second parity for the second group of data bits, and assemble the second parity into a second column of parity bits; and
calculate a third parity for the third group of data bits, and assemble the third parity into a third column of parity bits.

14. A data encoder circuit, the data encoder circuit including circuitry operable to:
receive an un-encoded data set represented as an assay of columns and rows;
identify a first group of data bits traversing the un-encoded data set at a first angle;
identify a second group of data bits traversing the un-encoded data set at a second angle;
identify a third group of data bits traversing the un-encoded data set at a third angle;
calculate a first parity for the first group of data bits, and assemble the first parity into a first column of parity bits;
calculate a second parity for the second group of data bits, and assemble the second parity into a second column of parity bits; and
calculate a third parity for the third group of data bits, and assemble the third parity into a third column of parity bits.

15. The data encoder circuit of claim 14, wherein the first group of data bits includes one data bit from each column of the un-encoded data set.

16. The data encoder circuit of claim 14, wherein calculating the first
parity is exclusive of the second parity and exclusive of the third parity, wherein calculating the second parity is exclusive of the first parity and exclusive of the third parity, and wherein calculating the third parity is exclusive of the first parity and the second parity.

17. The data encoder circuit of claim 14, wherein calculating the third parity includes using the first parity and the second parity.

18. The data encoder circuit of claim 17, wherein calculating the second parity includes using the first parity, but is exclusive of the third parity.

19. The data encoder circuit of claim 14, wherein the first angle is different from at least one of the second angle and the third angle.

* * * * *